(12) United States Patent
Lee et al.

(10) Patent No.: US 9,559,114 B2
(45) Date of Patent: Jan. 31, 2017

(54) MANUFACTURING METHOD OF THREE-DIMENSIONAL NON-VOLATILE MEMORY DEVICE INCLUDING A SELECTION GATE HAVING AN L SHAPE

(71) Applicant: SK hynix Inc., Gyeonggi-do (KR)

(72) Inventors: Ki Hong Lee, Gyeonggi-do (KR); Seung Ho Pyi, Gyeonggi-do (KR); Sung Chul Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 14/272,056

(22) Filed: May 7, 2014

(65) Prior Publication Data
US 2014/0242765 A1    Aug. 28, 2014

Related U.S. Application Data

(62) Division of application No. 13/477,632, filed on May 22, 2012, now Pat. No. 8,754,485.

(30) Foreign Application Priority Data

May 24, 2011    (KR) .................. 10-2011-0049021

(51) Int. Cl.
   *H01L 27/115*    (2006.01)
   *H01L 29/792*    (2006.01)
(52) U.S. Cl.
   CPC ..... *H01L 27/11582* (2013.01); *H01L 27/1157* (2013.01); *H01L 29/7926* (2013.01)

(58) Field of Classification Search
   CPC .... H01L 27/11582; H01L 27/24; H01L 45/04; H01L 2924/1443
   See application file for complete search history.

(56) References Cited

U.S. PATENT DOCUMENTS

| 7,170,786 | B2 * | 1/2007 | Chien ............... H01L 27/11524 365/185.17 |
| 2005/0085042 | A1 * | 4/2005 | Chun ................ H01L 21/76229 438/275 |
| 2005/0101087 | A1 | 5/2005 | Endoh et al. |
| 2005/0139900 | A1 * | 6/2005 | Jung ..................... H01L 27/115 257/319 |

(Continued)

FOREIGN PATENT DOCUMENTS

CN    101814508    8/2010

OTHER PUBLICATIONS

Office Action issued by the State Intellectual Property Office of the People's Republic of China on Jan. 19, 2016.

*Primary Examiner* — Bilkis Jahan
(74) *Attorney, Agent, or Firm* — IP & T Group LLP

(57) ABSTRACT

A 3-dimensional (3-D) non-volatile memory device includes a first channel protruding from a substrate, a selection gate formed on sidewalls of the first channel and in an L shape, and a gate insulating layer interposed between the first channel and the selection gate and surrounding the first channel. A method of manufacturing a 3-D non-volatile memory device includes forming first channels protruding from a substrate, forming a first gate insulating layer surrounding the first channels, and forming first selection gates having an L shape on sidewalls of the first channels on which the first gate insulating layers are formed.

20 Claims, 35 Drawing Sheets

(56) References Cited

U.S. PATENT DOCUMENTS

| | | | |
|---|---|---|---|
| 2007/0158736 A1* | 7/2007 | Arai | H01L 27/105 257/315 |
| 2009/0289293 A1* | 11/2009 | Izumida | H01L 27/11521 257/316 |
| 2010/0118610 A1 | 5/2010 | Katsumata et al. | |
| 2010/0213527 A1* | 8/2010 | Shim et al. | 257/314 |
| 2010/0244121 A1* | 9/2010 | Loiko et al. | 257/325 |
| 2011/0062510 A1* | 3/2011 | Joo | H01L 27/11578 257/324 |
| 2012/0119289 A1* | 5/2012 | Kim | H01L 27/10876 257/330 |

\* cited by examiner

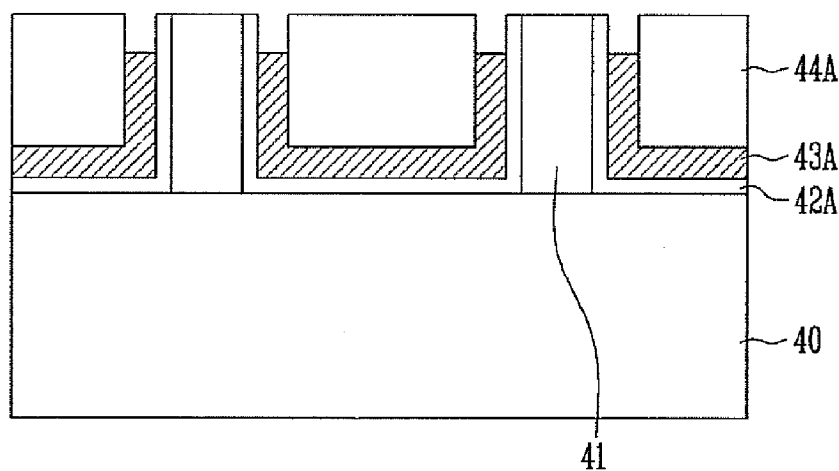
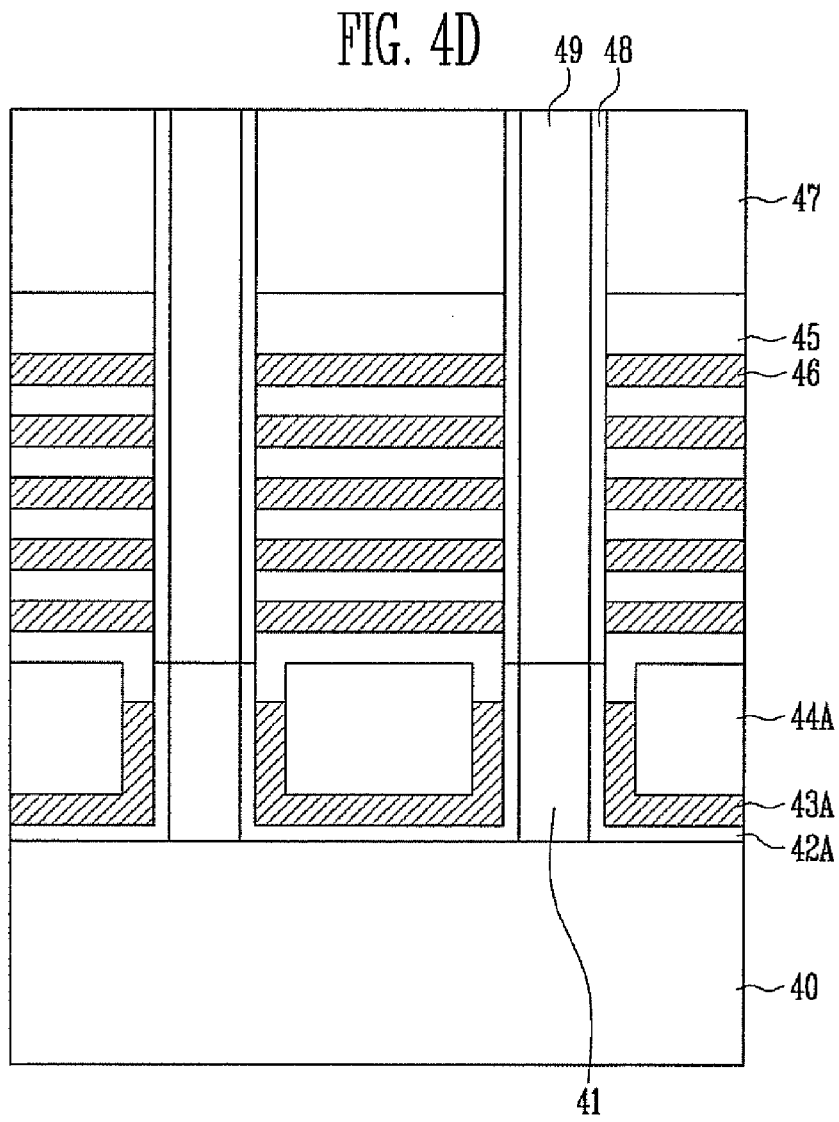

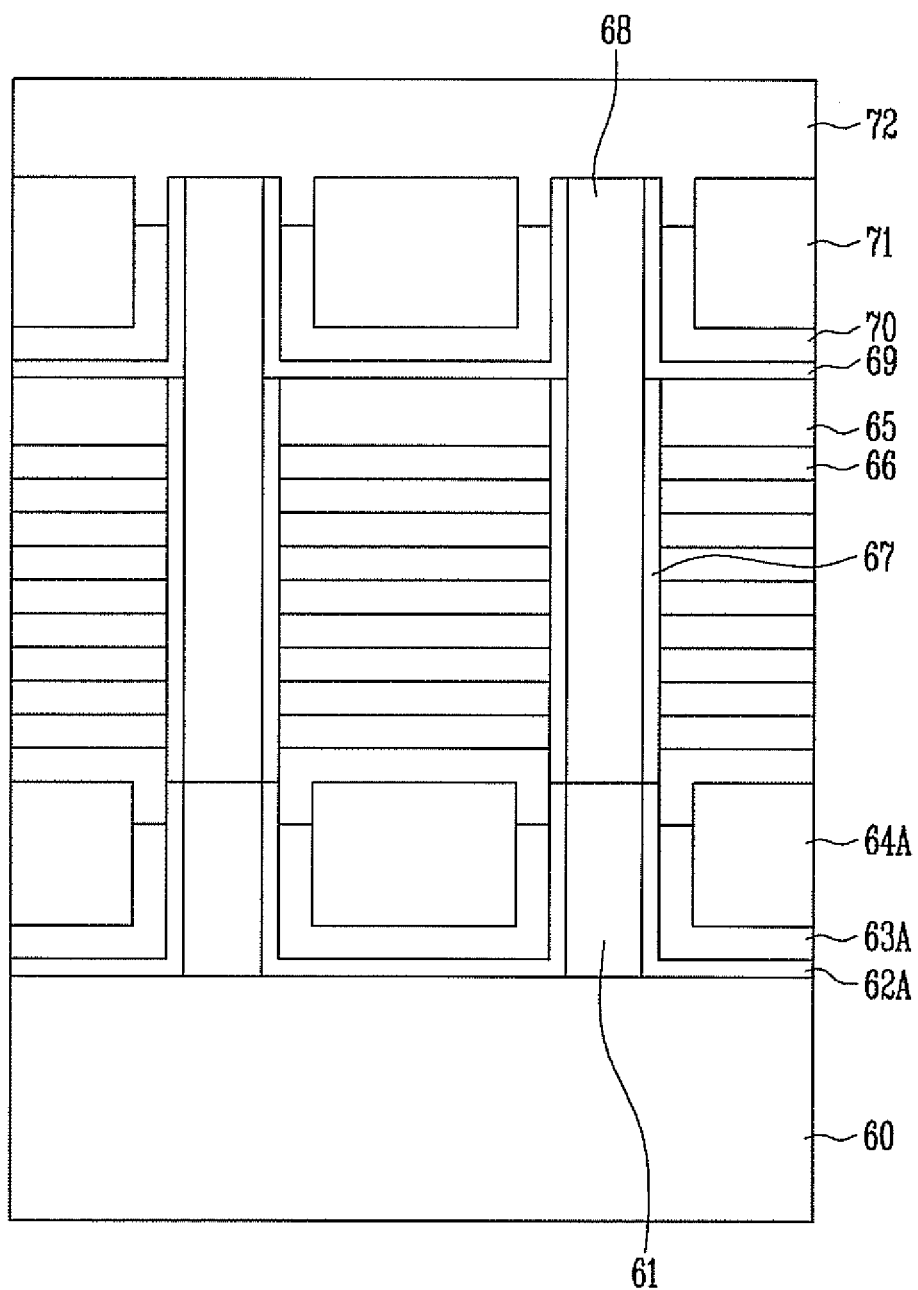

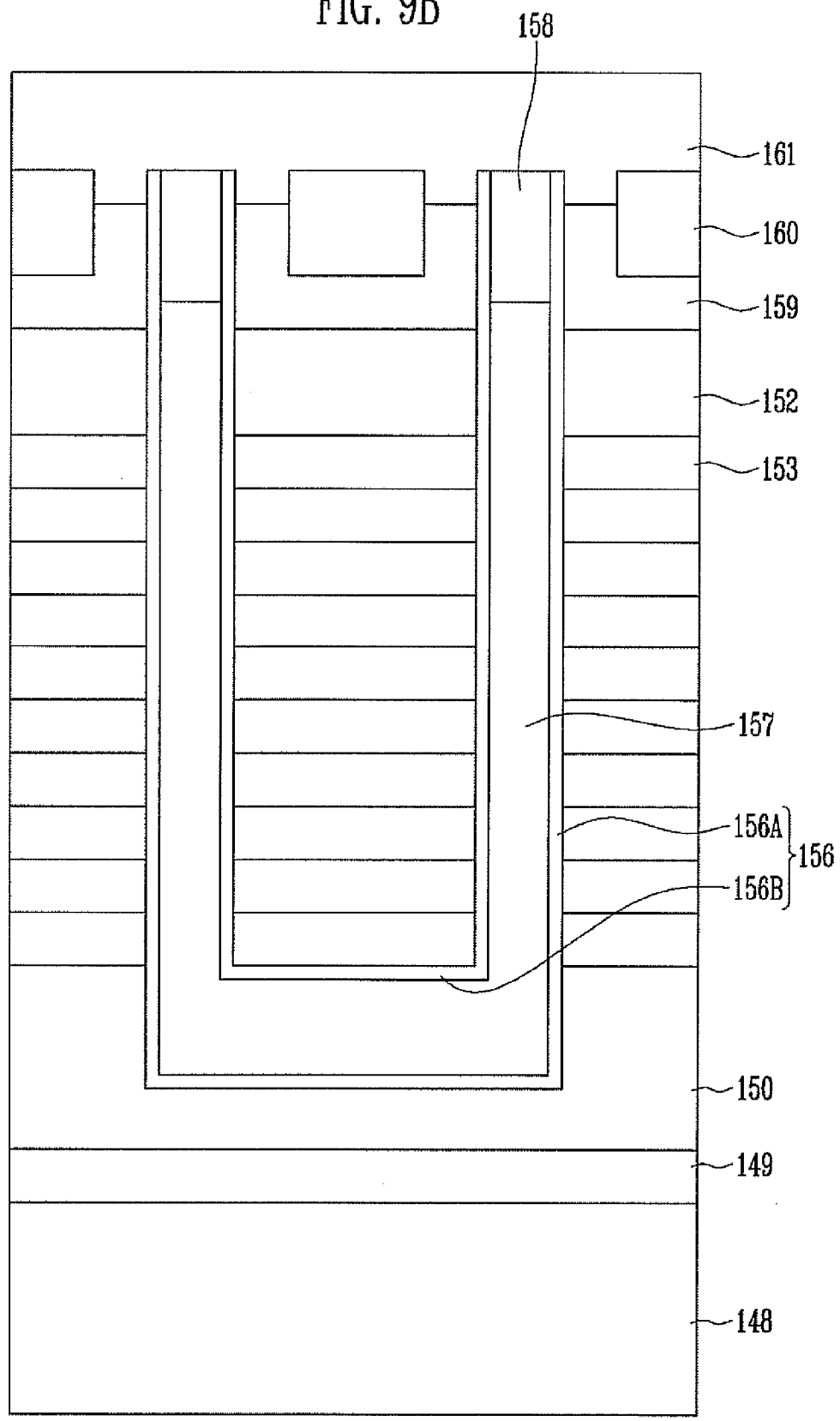

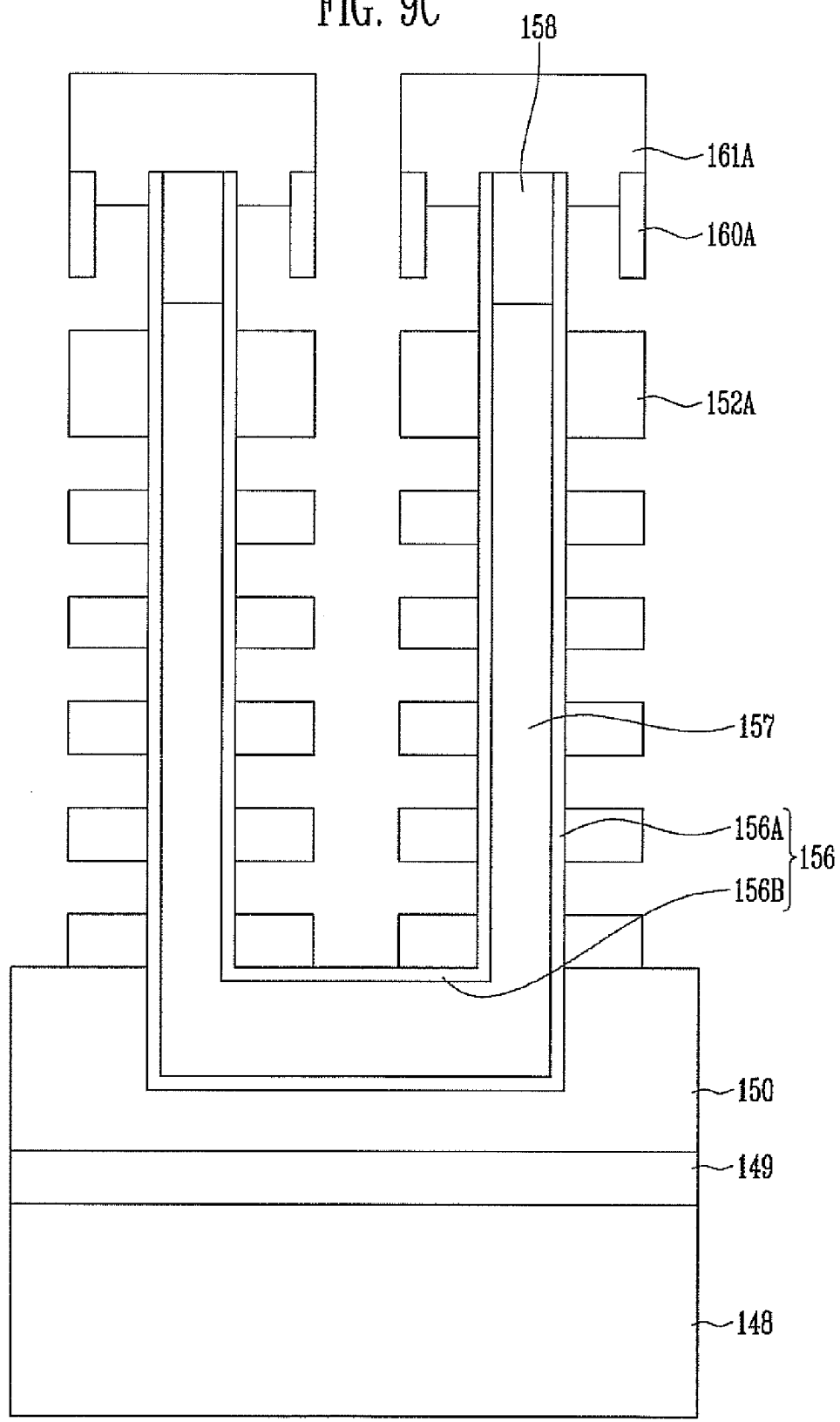

MANUFACTURING METHOD OF THREE-DIMENSIONAL NON-VOLATILE MEMORY DEVICE INCLUDING A SELECTION GATE HAVING AN L SHAPE

CROSS-REFERENCE TO RELATED APPLICATION

This application is a division of U.S. patent application Ser. No. 13/477,632 filed on May 22, 2012, which claims priority to Korean patent application number 10-2011-0049021 filed on May 24, 2011. The disclosure of each of the foregoing application is incorporated herein by reference in its entirety.

BACKGROUND

Exemplary embodiments relate to a semiconductor device and a method of manufacturing the same and, more particularly, to a non-volatile memory device having a 3-dimensional (3-D) structure (hereinafter simply referred to as a '3-D non-volatile memory device') and a method of manufacturing the same.

A non-volatile memory device retains data although the supply of power is stopped. As memory devices having a 2-dimensional (2-D) structure in which memory cells are fabricated on a silicon substrate in the form of a single layer have reached the limit in increasing the degree of integration, there is proposed a 3-D non-volatile memory device in which memory cells are vertically stacked on a silicon substrate.

The structure and features of the known 3-D non-volatile memory device are described below with reference to relevant drawings.

FIGS. 1A and 1B are cross-sectional views illustrating a conventional method of manufacturing a 3-D non-volatile memory device. It is to be noted that only part of one of strings is shown in the drawings, for the description purpose. In other words, only a plurality of memory cells and one selection transistor stacked along a channel protruded from a substrate are shown.

As shown in FIG. 1A, a plurality of interlayer insulating layers 11 and a plurality of sacrificial layers (not shown) are alternately stacked over a substrate 10 and are then etched to form a trench. The plurality of sacrificial layers is formed to secure regions where a plurality of word lines and a plurality of selection gate lines will be formed in subsequent processes. In general, since the selection gate line has a longer length than the word line, the sacrificial layer for securing the selection gate line regions is thicker than the sacrificial layer for securing the word line regions.

A channel 12 is formed in the trench. The plurality of interlayer insulating layers 11 and the plurality of sacrificial layers are etched to form a slit between the adjacent channels 12.

A plurality of word line regions and a plurality of selection gate line regions are formed by removing the plurality of sacrificial layers exposed through the inner wall of the slit. Here, the selection gate line region D1 is thicker than the word line region D2.

A conductive layer 13 is formed on the entire surface of the resulting structure in which the plurality of word line regions and the plurality of selection gate line regions are formed. Here, the plurality of word line regions is fully filled with the conductive layer 13, whereas the plurality of selection gate line regions is partially filled with the conductive layer 13.

As shown in FIG. 1B, the conductive layer 13 formed on the inner wall of the slit is etched in order to separate a plurality of word lines 13A and a plurality of selection gate lines from each other. In this process, however, the conductive layer 13 formed in the plurality of selection gate line regions may be fully removed (reference numeral 'A').

In general, since the selection transistors of a non-volatile memory device have higher threshold voltages than memory cells, the threshold voltages of the selection transistors are to be controlled by controlling the impurity doping concentration of a channel. A conventional method of manufacturing a 3-D non-volatile memory device, however, may have difficulty in controlling the threshold voltages of the selection transistors because the channel is filled in the trench.

BRIEF SUMMARY

Exemplary embodiments relate to a 3-D non-volatile memory device and a method of manufacturing the same, which may prevent selection gate lines from being removed in an etch process for separating word lines from one another.

In accordance with an aspect of the present disclosure, there is provided a 3-D non-volatile memory device, including a first channel protruding from a substrate, a selection gate formed on the sidewalls of the first channel and in an L shape, and a gate insulating layer interposed between the first channel and the selection gate and surrounding the first channel.

In accordance with another aspect of the present disclosure, there is provided a method of manufacturing a 3-D non-volatile memory device, including forming first channels protruding from a substrate, forming a first gate insulating layer surrounding the first channels, and forming first selection gates having an L shape on the sidewalls of the first channels on which the first gate insulating layers are formed.

In accordance with another aspect of the present disclosure, there is provided a method of manufacturing a 3-D non-volatile memory device, including forming first channels protruding from a substrate, forming a first sacrificial layer on an entire surface of a structure in which the first channels are formed, forming a first interlayer insulating layer on the first sacrificial layer, forming first slits between neighboring first channels of the first channels by etching the first interlayer insulating layer and the first sacrificial layer to form the first sacrificial layer having an L shape and remaining on the sidewalls of the first channels, forming first selection gate regions by removing the first sacrificial layer exposed through the first slits, and forming first selection gates that each have an L shape by filling a first conductive layer in the first selection gate regions.

BRIEF DESCRIPTION OF THE DRAWINGS

FIGS. 4A to 4F are cross-sectional views illustrating a method of manufacturing a 3-D non-volatile memory device according to a first embodiment of this disclosure;

FIGS. 5A to 5F are cross-sectional views illustrating a method of manufacturing a 3-D non-volatile memory device according to a second embodiment of this disclosure;

FIGS. 9A to 9E are cross-sectional views illustrating a method of manufacturing a 3-D non-volatile memory device according to a sixth embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
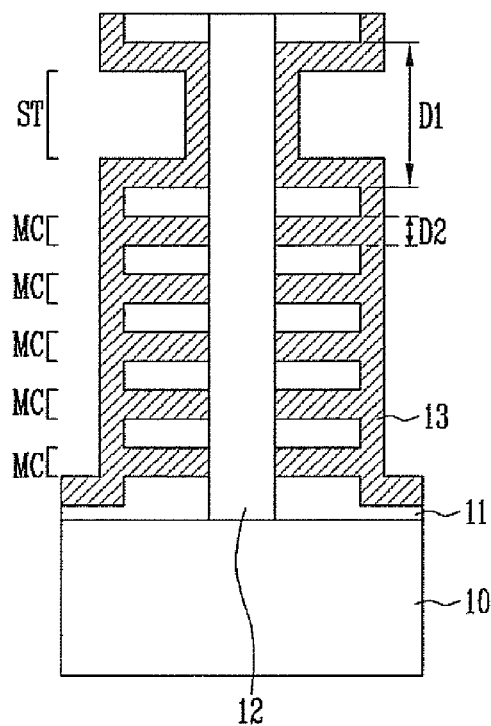
FIGS. 1A and 1B are cross-sectional views illustrating a conventional method of manufacturing a 3-D non-volatile memory device.
Figure 1B:
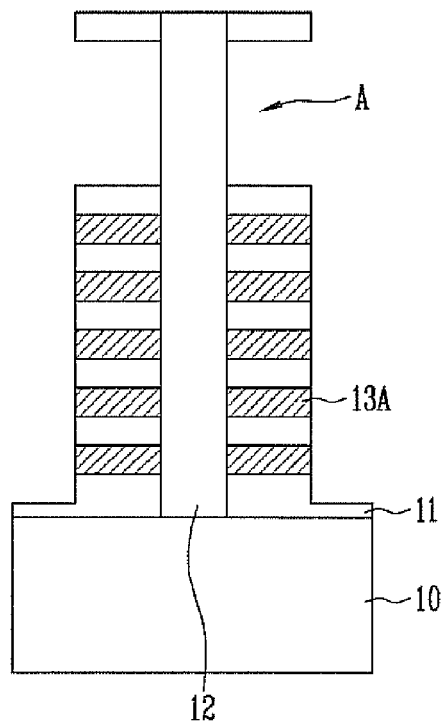
Figure 2A:
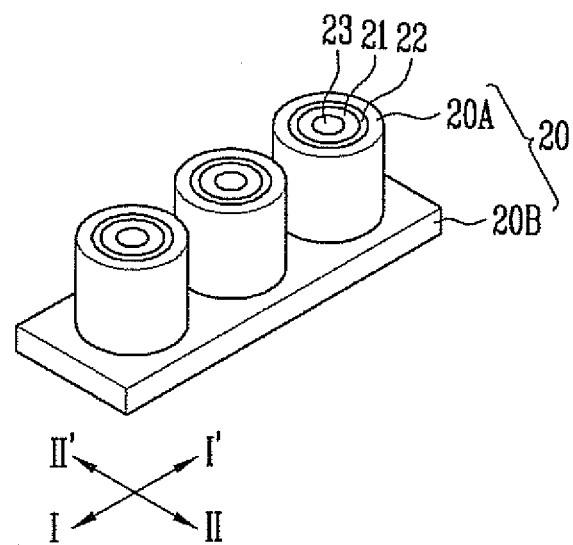
FIGS. 2A and 2B are perspective views illustrating the structure of a gate line in a 3-D non-volatile memory device according to an embodiment of this disclosure.
Figure 2B:
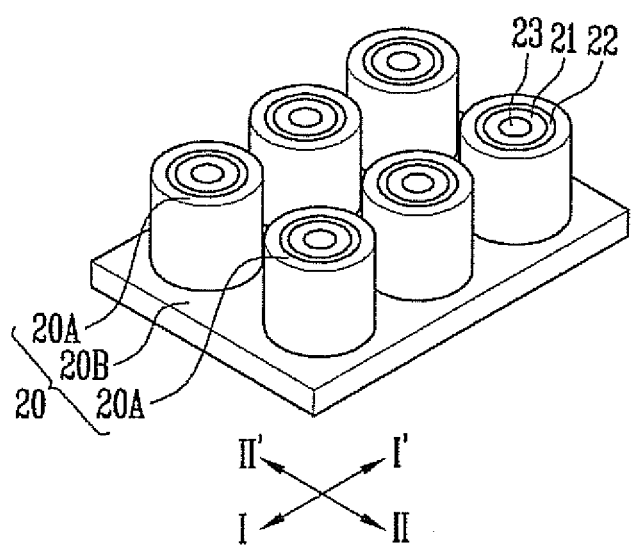

FIGS. 2A and 2B are perspective views illustrating the structure of a gate line in a 3-D non-volatile memory device according to an embodiment of this disclosure.

As shown in FIG. 2A, the 3-D non-volatile memory device of the present embodiment includes a plurality of first channels 21 protruded from a substrate (not shown). The plurality of first channels 21 are arranged in a first direction I-I' and a second direction II-II' crossing the first direction I-I'. It is to be noted that only a column of channels extended in the first direction I-I' is shown in the drawings, for the description purpose.

Impurities are doped onto the tops and sidewalls of the first channels 21 in order to control the threshold voltages of selection transistors.

The 3-D non-volatile memory device further includes selection gates 20 formed on the respective sidewalls of the first channels 21 in an L shape. The selection gates 20 are formed in such a way to surround the first channels 21, respectively, and each of the selection gates 20 has an L-shaped section. For example, each of the selection gates 20 may include a first region 20A and a second region 20B. The first region 20A is formed to surround the sidewall of the first channel 21. The second region 20B is formed at the bottom of a gap region between the first channel 21 and another first channel 21 that is adjacent to the first channel 21 and is formed to couple the first channels 21 arranged in the first direction I-I'.

The second regions 20B of the select gates 20 formed are extended in the first direction I-I', thus forming a gate line. A plurality of the gate lines are extended in parallel and each to couple the first channels 21 arranged in the first direction I-I'. It is to be noted that only one of the gate lines is shown in FIG. 2A, for the description purpose.

The present embodiment illustrates an example that the gate line couples the first channels 21 included in the one channel column. More specifically, the second region 20B is formed at the bottom of the gap region between the first channels 21 that are included in the one channel column extending in the first direction.

The 3-D non-volatile memory device further includes gate insulating layers 22, each formed to surround the first channel 21 and interposed between the first channel 21 and the first region 20A of the gate 20. The gate insulating layer 22 may be formed of an oxide layer or may have a stack structure of an oxide layer, a nitride layer, and an oxide layer.

The 3-D non-volatile memory device may further include insulating layers 23 each filled in the central region of the first channel 21. In this case, the first channel 21 has a cylindrical type structure having the central axis removed. The first channel 21 may have the cylindrical type structure having the central axis filled as well.

FIG. 2B shows an example that one gate line couples first channels 21 included in two of channel columns. More specifically, the second region 20B of the gate 20 is formed at the bottom of a gap region between the first channels 21 included in at least two channel columns extending in a first direction I-I'.

In the 3-D non-volatile memory device including the gate lines constructed as above, adjacent strings share a source selection line, but they are driven by separate drain selection lines. Thus, program/read operations may be performed on a desired page.

Figure 3A:
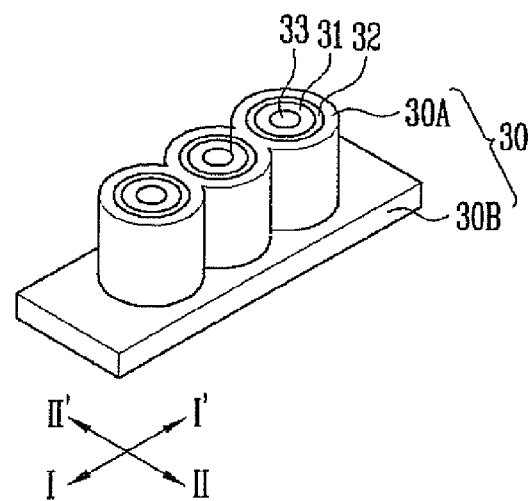
FIGS. 3A and 3B are perspective views illustrating the structure of a gate line in a 3-D non-volatile memory device according to another embodiment of this disclosure.
Figure 3B:
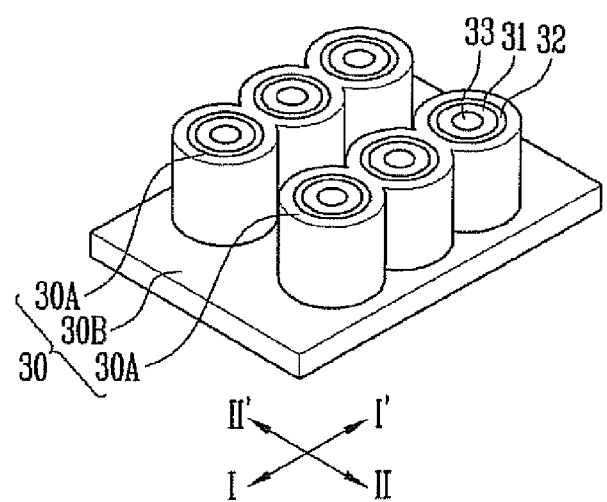

FIGS. 3A and 3B are perspective views illustrating the structure of a gate line in a 3-D non-volatile memory device according to another embodiment of this disclosure.

As shown in FIG. 3A, the 3-D non-volatile memory device of the present embodiment includes a plurality of first channels 31, a plurality of gates 30, and a plurality of gate insulating layers 32. The plurality of first channels 31 is protruded from a substrate (not shown). The gates 30 are formed in an L shape and includes first regions 30A formed on the sidewalk of the first channels 31, respectively, and second regions 30B extending in a first direction I-I'. The gates 30 couple the first channels 31 arranged in the first direction I-I'. The gate insulating layers 32 are formed to surround the first channels 31, respectively, and are interposed between the first channels 31 and the gates 30, respectively. The 3-D non-volatile memory device may further include insulating layers 33 filled in the central regions of the first channels 31, respectively.

In the present embodiment, first regions 30A formed on the respective sidewalls of the first channels 31 arranged in the first direction I-I' are interconnected to couple the first channels 31 arranged in the first direction I-I'. More specifically, the first regions 30A fill a gap region between the first channels 31 arranged in the first direction I-I' so that they are extended in the first direction I-I' (that is, the first regions 30A are overlapped with each other). Thus, the first channels 31 arranged in the first direction I-I' may be coupled not only through the second regions 30B, but also though the first regions 30A.

FIG. 3B shows an example that one gate line couples first channels 31 included in two of channel columns. In the 3-D non-volatile memory device including the gate lines constructed as above, adjacent strings share a source selection line, but they are driven by separate drain selection lines. Thus, program/read operations may be performed on a desired page.

Methods of manufacturing a 3-D non-volatile memory device according to first to sixth embodiments of the present disclosure are described below with reference to FIG. 4A to 9D. In particular, some methods of manufacturing the 3-D non-volatile memory device including the gate line described with reference to FIG. 2A are described below, and the cross-sectional views of FIG. 4A to 9D refer to sections taken along central axes of the channels 21 adjacent in the second direction II-II' of FIG. 2A. It is to be noted that the methods may be likewise applied to methods of manufacturing the 3-D non-volatile memory devices including the gate lines described with reference to FIGS. 2B, 3A, and 3B.

FIGS. 4A to 4F are cross-sectional views illustrating a method of manufacturing a 3-D non-volatile memory device according to a first embodiment of this disclosure. In the first embodiment, a method of manufacturing a vertical channel type 3-D non-volatile memory device in which a plurality of memory cells is stacked along a channel protruded from a substrate is described below.

Figure 4A:
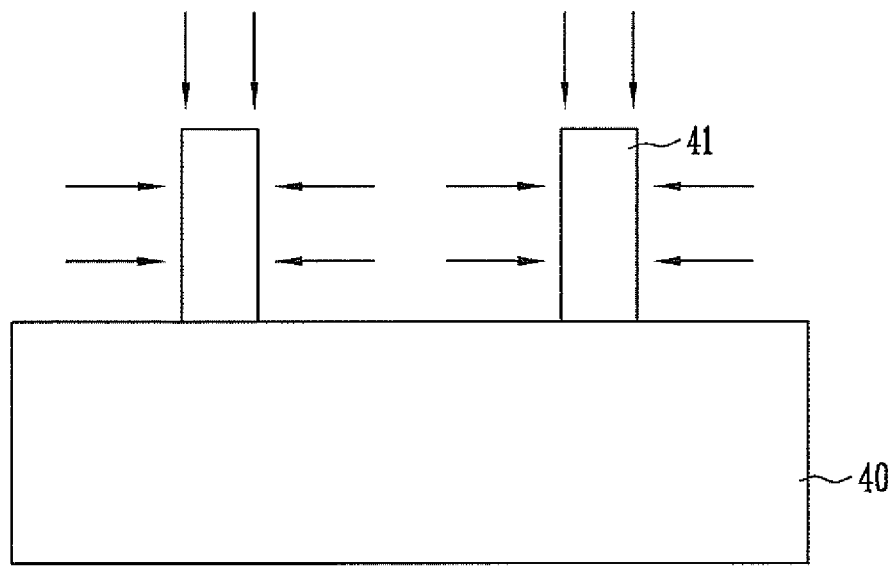

As shown in FIG. 4A, a plurality of first channels protruded from a substrate 40 are formed. For example, the plurality of first channels 41 may be formed in such a manner that a buffer layer (not shown) is formed on the substrate 40, the buffer layer is etched to form first trenches, the first trenches are filled with a channel layer, and the buffer layer is then removed. Thus, the plurality of first channels 41 protruded from the substrate 40 is formed.

Impurities are doped onto the tops and sidewalls of the first channels 41 (see arrows in FIG. 4A). For example, the impurities may be doped using a plasma doping process or an ion implantation process. In general, the selection transistors of a non-volatile memory device have higher threshold voltages than memory cells. For this reason, in the present disclosure, the threshold voltages of the selection transistors are controlled by doping the impurities onto the tops and sidewalk of the first channels 41.

Figure 4B:
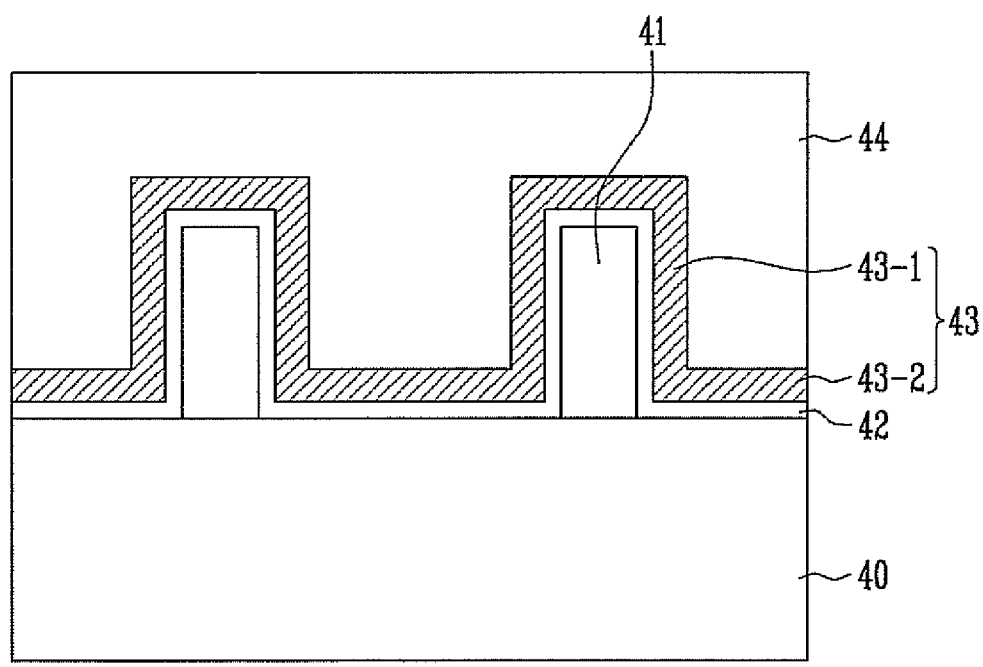

As shown in FIG. 4B, a first gate insulating layer 42 and a first conductive layer 43 are formed over the entire surface of the resulting structure on which the plurality of first channels 41 are formed. The first conductive layer 43 is used to form first gates. The conductive layer 43-1 of the first conductive layer 43 formed on the sidewalk of the plurality of first channels 41 forms first regions of the first gates. The conductive layer 43-2 of the first conductive layer 43 formed at the bottom of a region between the first channels 41 adjacent to each other forms second regions of the first gates (i.e. a gate line). Accordingly, the first regions formed on the sidewalk of the first channels 41 arranged in the first direction I-I' may be coupled or separated from one another by controlling the deposition thickness of the first conductive layer 43 (also see FIGS. 2A and 3A).

A first interlayer insulating layer 44 is formed on the first conductive layer 43.

As shown in FIG. 4C, a planarization process is performed until the top surfaces of the plurality of first channels 41 are exposed. The first conductive layers 43 exposed on the top of the planarized result are recessed by a specific depth.

In FIG. 4C, the first interlayer insulating layer etched by the planarization process is denoted by reference numeral '44A', the first gate insulating layer etched by the planarization process is denoted by reference numeral '42A', and the first conductive layer recessed by the specific depth is denoted by reference numeral '43A'.

As shown in FIG. 4D, a plurality of second interlayer insulating layers 45 and a plurality of second conductive layers 46 are alternately formed over the entire surface on which the recess process has been performed. The second conductive layers are used to form word lines and each may be formed of a polysilicon layer.

A buffer layer 47 is formed on the plurality of second interlayer insulating layers 45 and the plurality of second conductive layers 46. The buffer layer 47 is used to secure regions where the second gates will be formed. The buffer layer 47 may be formed of an oxide layer or a nitride layer or the buffer layer 47 may have a stack structure of an oxide layer and a nitride layer.

A plurality of second trenches are formed by etching the buffer layer 47, the plurality of second interlayer insulating layers 45, and the plurality of second conductive layers 46. A charge blocking layer, a charge trap layer, and a tunnel insulating layer 48 are formed on the inner wall of each of the plurality of second trenches. A plurality of second channels 49 are formed within the respective second trenches on which the charge blocking layer, the charge trap layer, and the tunnel insulating layer are formed. Accordingly, the plurality of second channels 49 coupled to the plurality of first channels 41 and a plurality of memory cells stacked along each of the second channels 49 are formed.

Figure 4E:
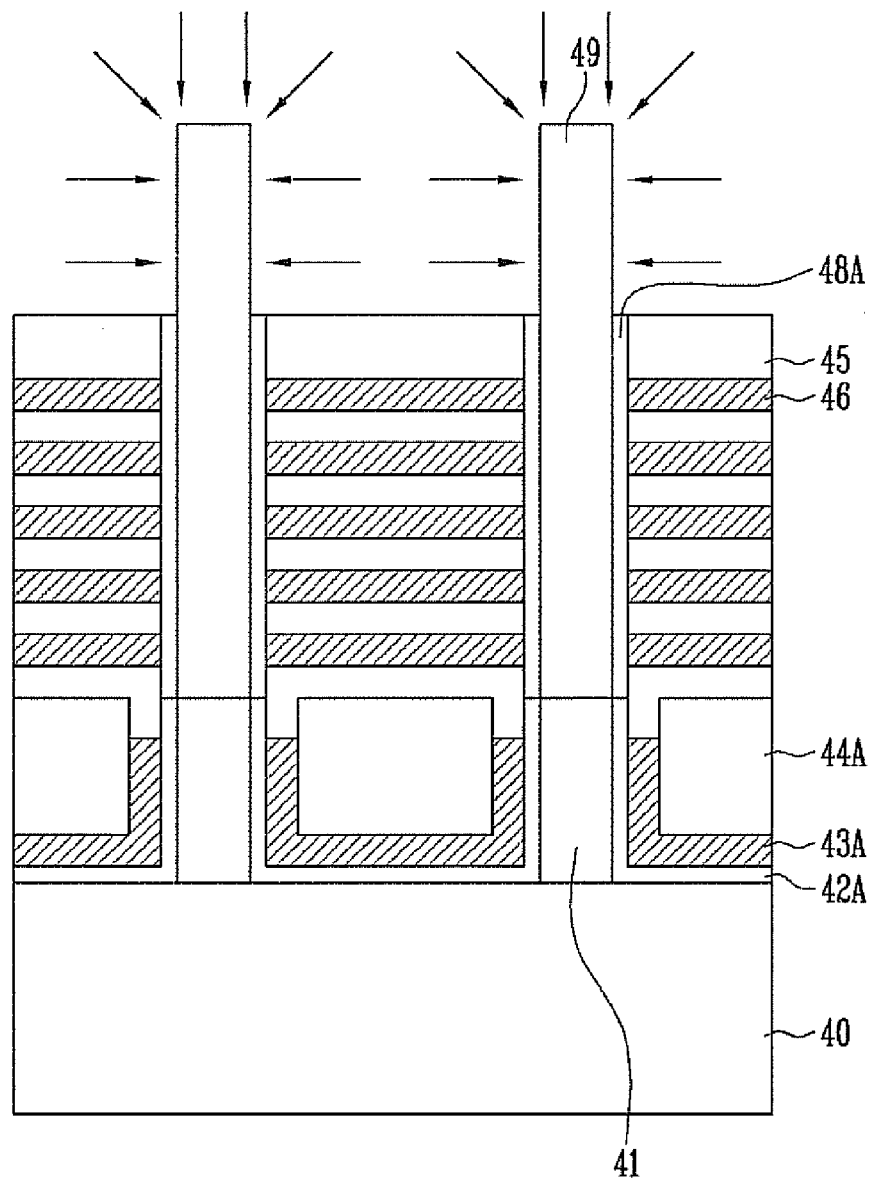

As shown in FIG. 4E, after the buffer layer 47 is removed, the charge blocking layer, the charge trap layer, and the tunnel insulating layer 48 surrounding the upper sidewalls of the plurality of second channels 49 are removed. In FIG. 4E, the charge blocking layers, the charge trap layers, and the tunnel insulating layers remaining after the removal process are collectively denoted by reference numeral '48A'.

Impurities are doped onto the tops and sidewalls of the plurality of second channels 49 exposed after removing the charge blocking layer, the charge trap layer, and the tunnel insulating layer 48 (see arrows in FIG. 4E).

Figure 4F:
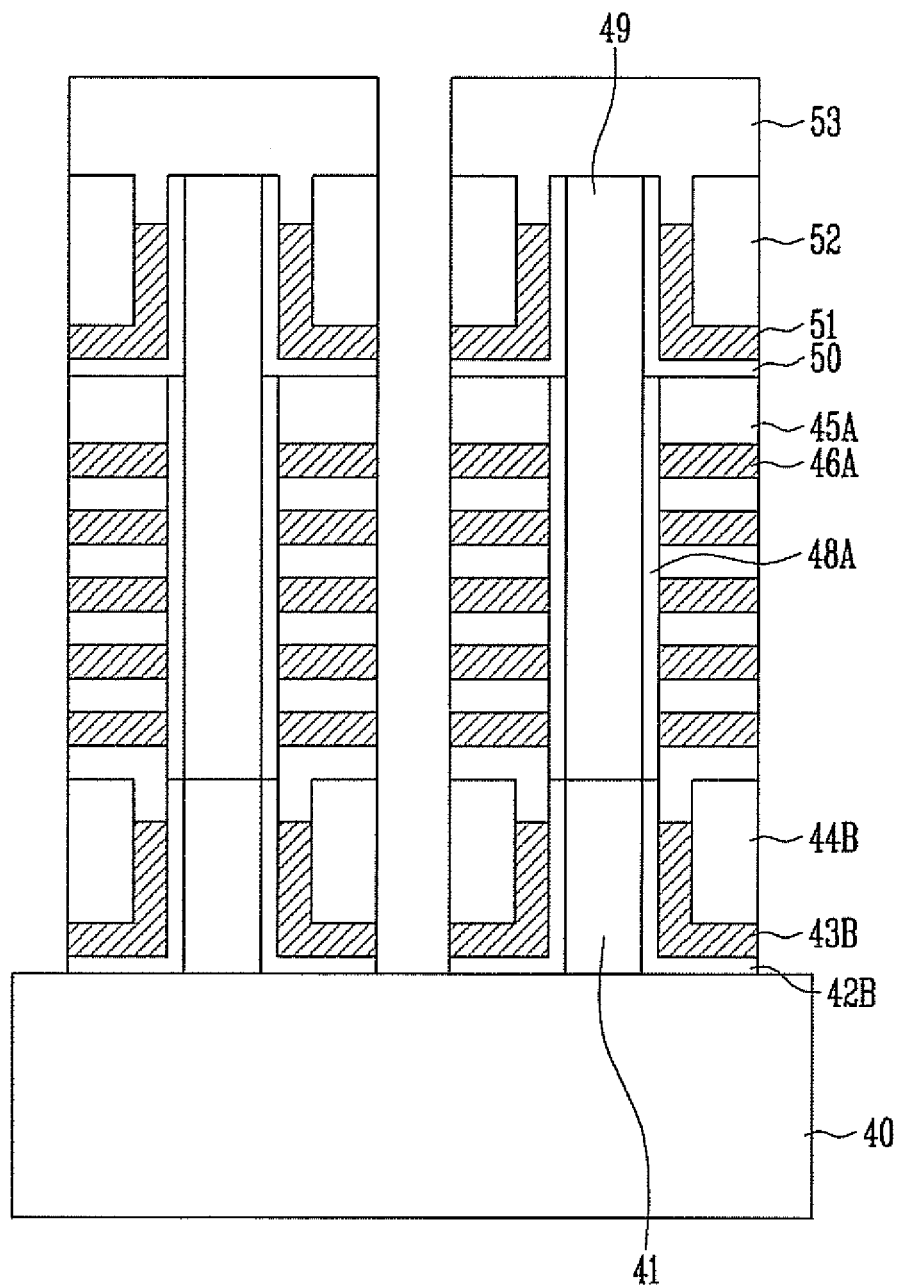

As shown in FIG. 4F, a second gate insulating layer 50 and a third conductive layer 51 are formed over the entire surface of the resulting structure into which the impurities have been doped. A third interlayer insulating layer 52 is formed on the third conductive layer 51. After a planarization process is performed until the top surfaces of the plurality of second channels 49 are exposed, the third conductive layers 51 exposed on the top of the planarized result are recessed by a specific depth. A fourth interlayer insulating layer 53 is formed on the entire surface of the recessed result.

A plurality of first slits are formed by etching the fourth interlayer insulating layer 53, the third interlayer insulating layer 52, the third conductive layer 51, the second gate insulating layer 50, the plurality of second interlayer insulating layers 45, the plurality of second conductive layers 46, the first interlayer insulating layer 44A, the first conductive layer 43A, and the first gate insulating layer 42A between the second channels 49 adjacent to each other.

Thus, the plurality of first gates 43B each having an L shape, the plurality of word lines 46A, and the plurality of second gates 51 each having an L shape are formed. The first gates 43B may form lower selection lines (that is, source selection lines), and the second gates 51 may form upper selection lines (that is, drain selection lines).

In FIG. 4F, the plurality of second interlayer insulating layers etched in the process of forming the first slits is denoted by reference numeral '45A', the first interlayer insulating layer etched in the process of forming the first slits is denoted by reference numeral '44B', and the first gate insulating layer etched in the process of forming the first slits is denoted by reference numeral '42B'.

The plurality of first gates 43B, the plurality of word lines 46A, and the plurality of second gates 51 exposed through the etched surfaces (that is, the inner walls of the plurality of first slits) may be silicidized.

In accordance with the first embodiment, the threshold voltages of lower selection transistors and upper selection transistors may be easily controlled because the impurities are doped onto the tops of the first channels 41 and the second channels 49.

FIGS. 5A to 5F are cross-sectional views illustrating a method of manufacturing a 3-D non-volatile memory device according to a second embodiment of this disclosure. In the second embodiment, a method of manufacturing a vertical channel type 3-D non-volatile memory device in which a plurality of memory cells are stacked along a channel protruded from a substrate is described below.

Figure 5A:
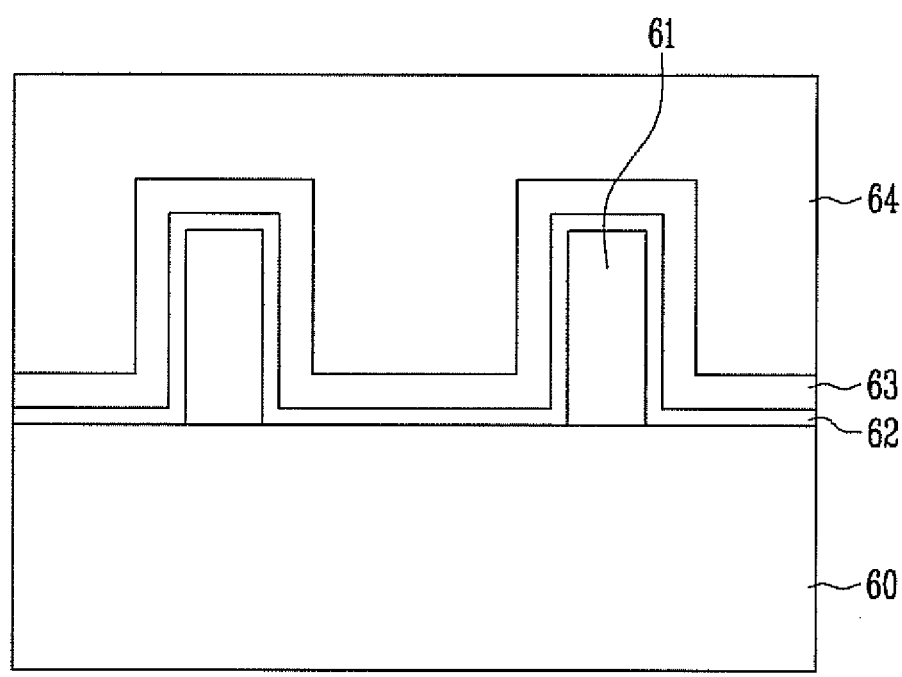

As shown in FIG. 5A, after a plurality of first channels 61 protruded from a substrate 60 are formed, impurities are doped onto the tops and sidewalls of the first channels 61.

A first gate insulating layer 62 and a first sacrificial layer 63 are formed over the entire surface of the resulting structure on which the plurality of first channels 61 are formed. A first interlayer insulating layer 64 is formed on the first sacrificial layer 63. The first sacrificial layer 63 is used to secure regions for first gates to be formed in a subsequent process and may be a nitride layer.

Figure 5B:
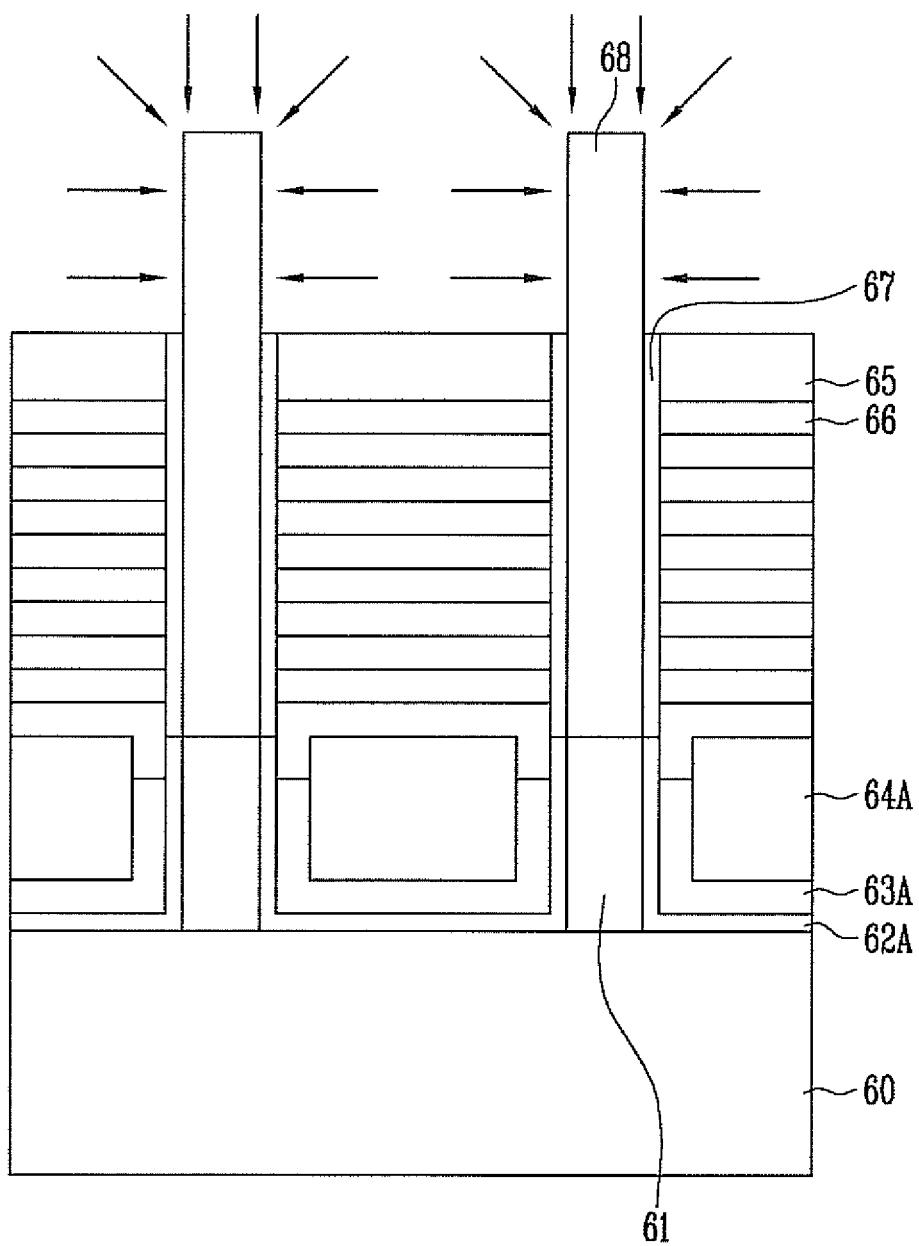

As shown in FIG. 5B, a planarization process is performed until the top surfaces of the plurality of first channels 61 are exposed. The first sacrificial layer 63 exposed on the top of the planarized result are recessed by a specific depth.

In FIG. 5B, the first interlayer insulating layer etched by the planarization process is denoted by reference numeral '64A', the first gate insulating layer etched by the planarization process is denoted by reference numeral '62A', and the first sacrificial layer recessed by the specific depth is denoted by reference numeral '63A'.

A plurality of second interlayer insulating layers 65 and a plurality of second sacrificial layers 66 are alternately formed over the entire surface on which the recess process has been performed. The second sacrificial layers are used to secure regions for word lines and each may be formed of a nitride layer.

A buffer layer (not shown) is formed on the plurality of second interlayer insulating layers 65 and the plurality of second sacrificial layers 66. A plurality of second trenches are formed by etching the buffer layer, the plurality of second interlayer insulating layers 65, and the plurality of second sacrificial layers 66. A charge blocking layer, a charge trap layer, and a tunnel insulating layer 67 are formed on the inner wall of each of the plurality of second trenches. A plurality of second channels 68 are formed within the respective second trenches on which the charge blocking layer, the charge trap layer, and the tunnel insulating layer 67 are formed.

After the buffer layer is removed, the charge blocking layer, the charge trap layer, and the tunnel insulating layer 67 formed to surround the upper sidewalls of the plurality of second channels 68 are removed. Impurities are doped onto the tops and sidewalls of the plurality of second channels 68 exposed after removing the charge blocking layer, the charge trap layer, and the tunnel insulating layer 67 (see arrows in FIG. 5B).

As shown in FIG. 5C, a second gate insulating layer 69 and a third sacrificial layer 70 are formed over the entire surface of the resulting structure into which the impurities have been doped. A third interlayer insulating layer 71 is formed on the third sacrificial layer 70. The third sacrificial layer 70 is used to secure regions for second gates to be formed in a subsequent process.

Next, a planarization process is performed until the top surfaces of the plurality of second channels 68 are exposed. The third sacrificial layers 70 exposed on the top of the planarized result are recessed by a specific depth. A fourth interlayer insulating layer 72 is formed on the entire surface of the recessed result.

Figure 5D:
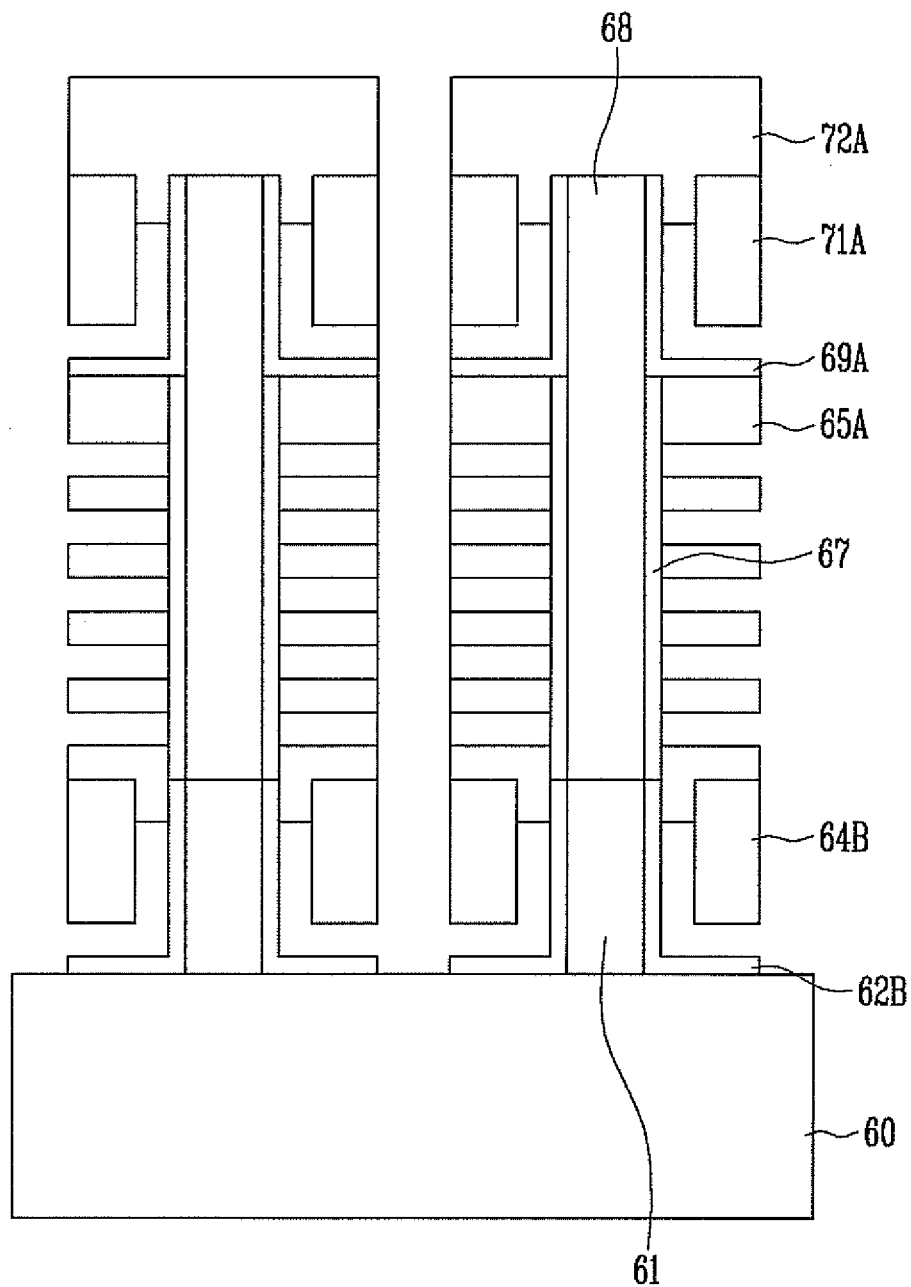

As shown in FIG. 5D, a plurality of first slits are formed by etching the fourth interlayer insulating layer 72, the third interlayer insulating layer 71, the third sacrificial layer 70, the second gate insulating layer 69, the plurality of second interlayer insulating layers 65, the plurality of second sacrificial layers 66, the first interlayer insulating layer 64A, the first sacrificial layer 63A, and the first gate insulating layer 62A between the second channels 68 adjacent to each other.

A plurality of first gate regions each having an L shape, a plurality of word line regions, and a plurality of second gate regions each having an L shape are formed by removing the first sacrificial layer 63A, the plurality of second sacrificial layers 66, and the third sacrificial layer 70 exposed though the inner walls of the plurality of first slits. In FIG. 5D, the etched fourth interlayer insulating layer is denoted by reference numeral '72A', the etched third interlayer insulating layer is denoted by reference numeral '71A', the etched second gate insulating layer is denoted by reference numeral '69A', the plurality of etched second interlayer insulating layers are denoted by reference numeral '65A', the etched first interlayer insulating layer is denoted by reference numeral '64B', and the etched first gate insulating layer is denoted by reference numeral '62B'.

Figure 5E:
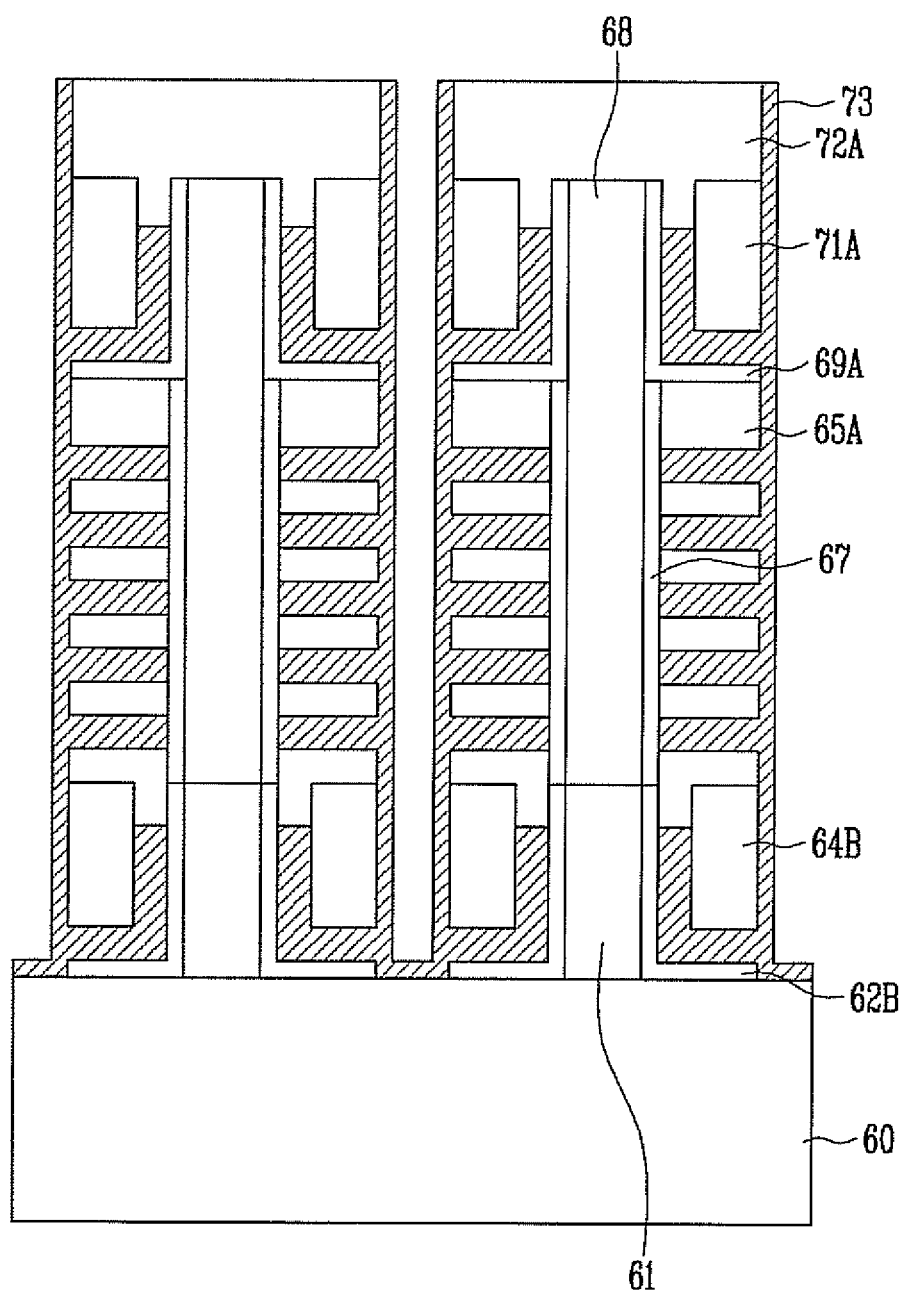

As shown in FIG. 5E, a conductive layer 73 is formed on the entire surface of the resulting structure to fill the plurality of first gate regions, the plurality of word line regions, and the plurality of second gate regions. The conductive layer 73 may be a polysilicon layer or a metal layer.

Figure 5F:
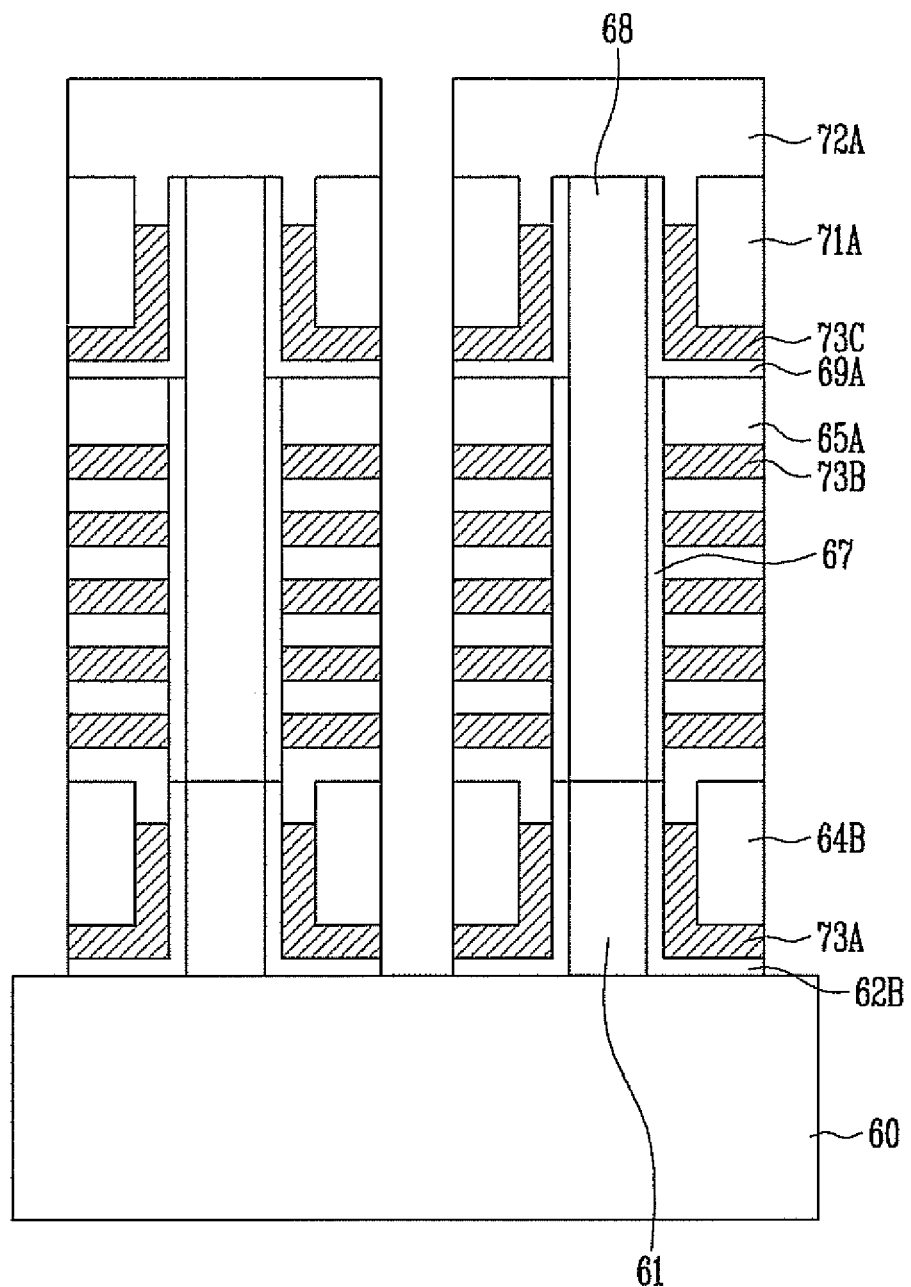

As shown in FIG. 5F, the conductive layer 73 formed on the inner walls of the plurality of first slits is etched so that the plurality of first gates each having an L shape, the plurality of word lines, and the plurality of second gates each having an L shape are separated from one another.

Accordingly, a plurality of first gates 73A each having an L shape, a plurality of word lines 73B, and a plurality of second gates 73C each having an L shape are formed.

If the conductive layer 73 is a polysilicon layer, the plurality of first gates 73A, the plurality of word lines 73B, and the plurality of second gates 73C exposed through the inner walls of the plurality of first slits may be silicidized.

In accordance with the second embodiment, the threshold voltages of lower selection transistors and upper selection transistors may be easily controlled because the impurities are doped onto the tops of the first channels 61 and the second channels 68. Furthermore, since the first gates 73A each having an L shape and the second gates 73C each having an L shape are formed, the first gates 73A and the second gates 73C may be prevented from being fully removed in the process of separating the word lines from one another.

Furthermore, each of the first gate insulating layer 62 and the second gate insulating layer 69 may be formed of an oxide layer. If the gate insulating layer is formed of a charge blocking layer, a charge trap layer, and a tunnel insulating layer, the threshold voltages of selection transistors may rise or a distribution of the threshold voltages of memory cells may be widened because electrons are trapped in or detrapped from the charge trap layer. In accordance with the second embodiment, however, the above phenomena may be prevented from occurring by forming the gate insulating layer using the oxide layer.

FIGS. 6A to 6D are cross-sectional views illustrating a method of manufacturing a 3-D non-volatile memory device according to a third embodiment of this disclosure. In particular, in the third embodiment, a method of manufacturing a vertical channel type 3-D non-volatile memory device in which a plurality of memory cells are stacked along a channel protruded from a substrate is described below.

Figure 6A:
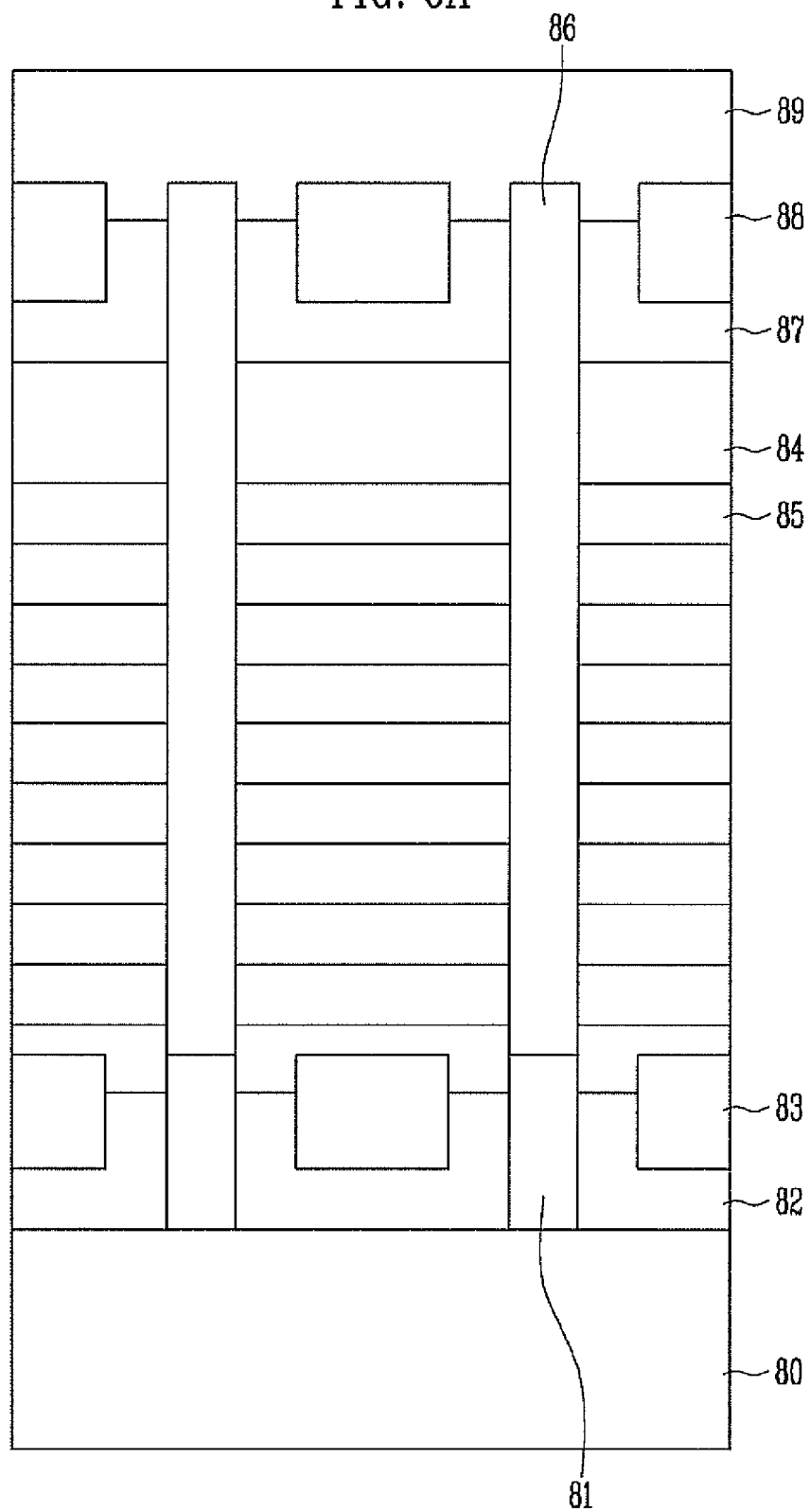
FIGS. 6A to 6D are cross-sectional views illustrating a method of manufacturing a 3-D non-volatile memory device according to a third embodiment of this disclosure.

As shown in FIG. 6A, after a plurality of first channels 81 protruded from a substrate 80 are formed, impurities are doped onto the tops and sidewalls of the first channels 81. A first sacrificial layer 82 is formed on the entire surface of the resulting structure in which the plurality of first channels 81 are formed, and a first interlayer insulating layer 83 is formed on the first sacrificial layer 82. Next, a planarization process is performed until the top surfaces of the plurality of first channels 81 are exposed. The first sacrificial layer 82 exposed on the top of the planarized result are recessed by a specific depth.

A plurality of second interlayer insulating layers 84 and a plurality of second sacrificial layers 85 are alternately formed over the entire surface of the recessed result. A buffer layer (not shown) is formed over the plurality of second interlayer insulating layers 84 and the plurality of second sacrificial layers 85. A plurality of second trenches are formed by etching the buffer layer, the plurality of second interlayer insulating layers 84, and the plurality of second sacrificial layers 85. A plurality of second channels 86 are formed in the plurality of second trenches.

The tops of the plurality of second channels 86 are exposed by removing the buffer layer, and impurities are doped onto the exposed tops and sidewalls of the plurality of second channels 86. After forming a third sacrificial layer 87 on the entire surface of the resulting structure into which the impurities are doped, a third interlayer insulating layer 88 is formed on the third sacrificial layer 87. Next, a planarization process is performed until the top surfaces of the plurality of second channels 86 are exposed, and the third sacrificial layers 87 exposed on the top of the planarized result are recessed by a specific depth. A fourth interlayer insulating layer 89 is formed on the entire surface of the recessed result.

Figure 6B:
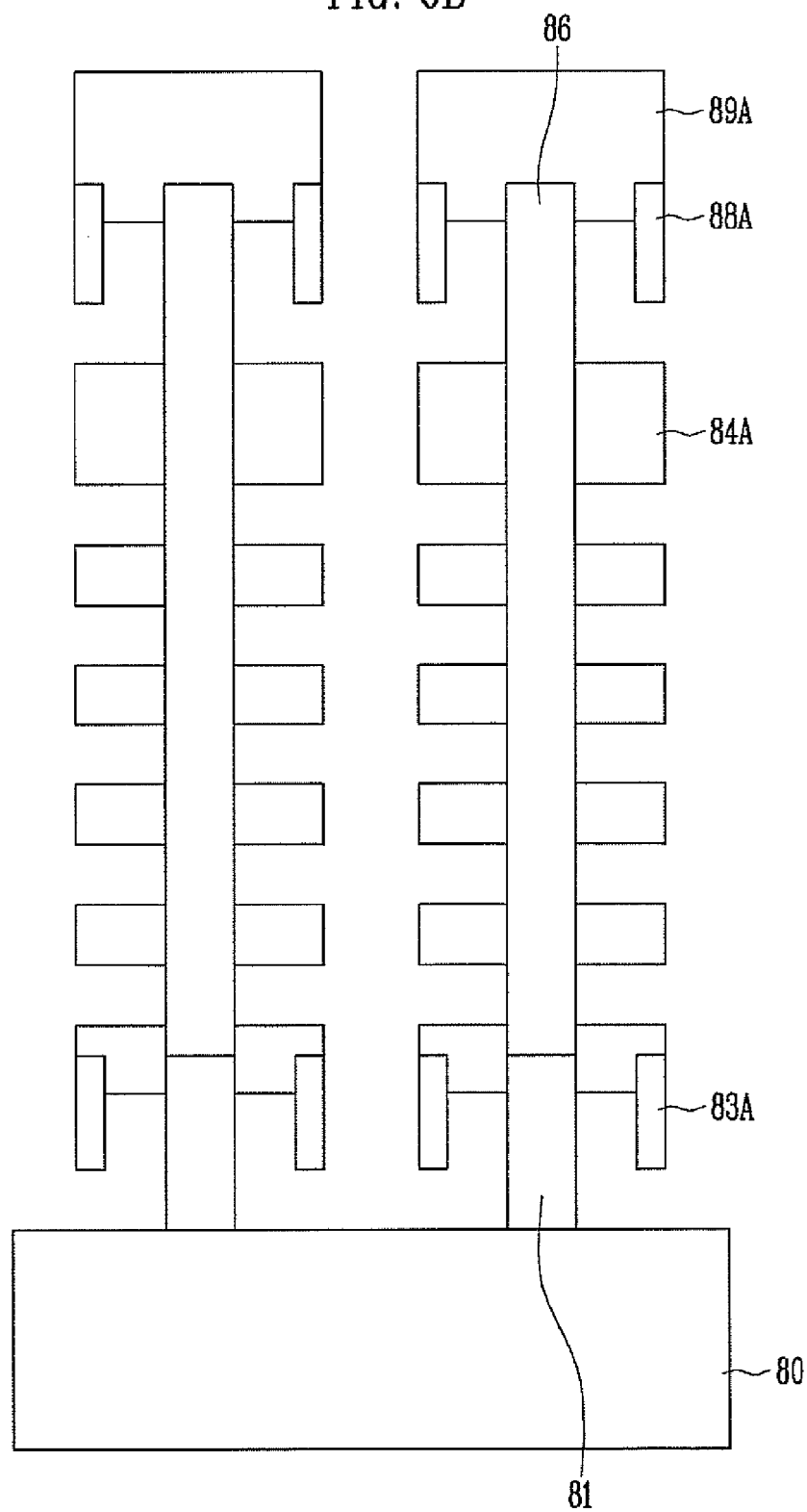

As shown in FIG. 6B, a plurality of first slits are formed by etching the fourth interlayer insulating layer 89, the third interlayer insulating layer 88, the third sacrificial layer 87, the plurality of second interlayer insulating layers 84, the plurality of second sacrificial layers 85, the first interlayer insulating layer 83, and the first sacrificial layer 82 between the second channels 86 that are adjacent to each other.

A plurality of first gate regions each having an L shape, a plurality of word line regions, and a plurality of second gate regions each having an L shape are formed by removing the first sacrificial layer 82, the plurality of second sacrificial layers 85, and the third sacrificial layer 87 which are exposed through the inner walls of the plurality of first slits.

Figure 6C:
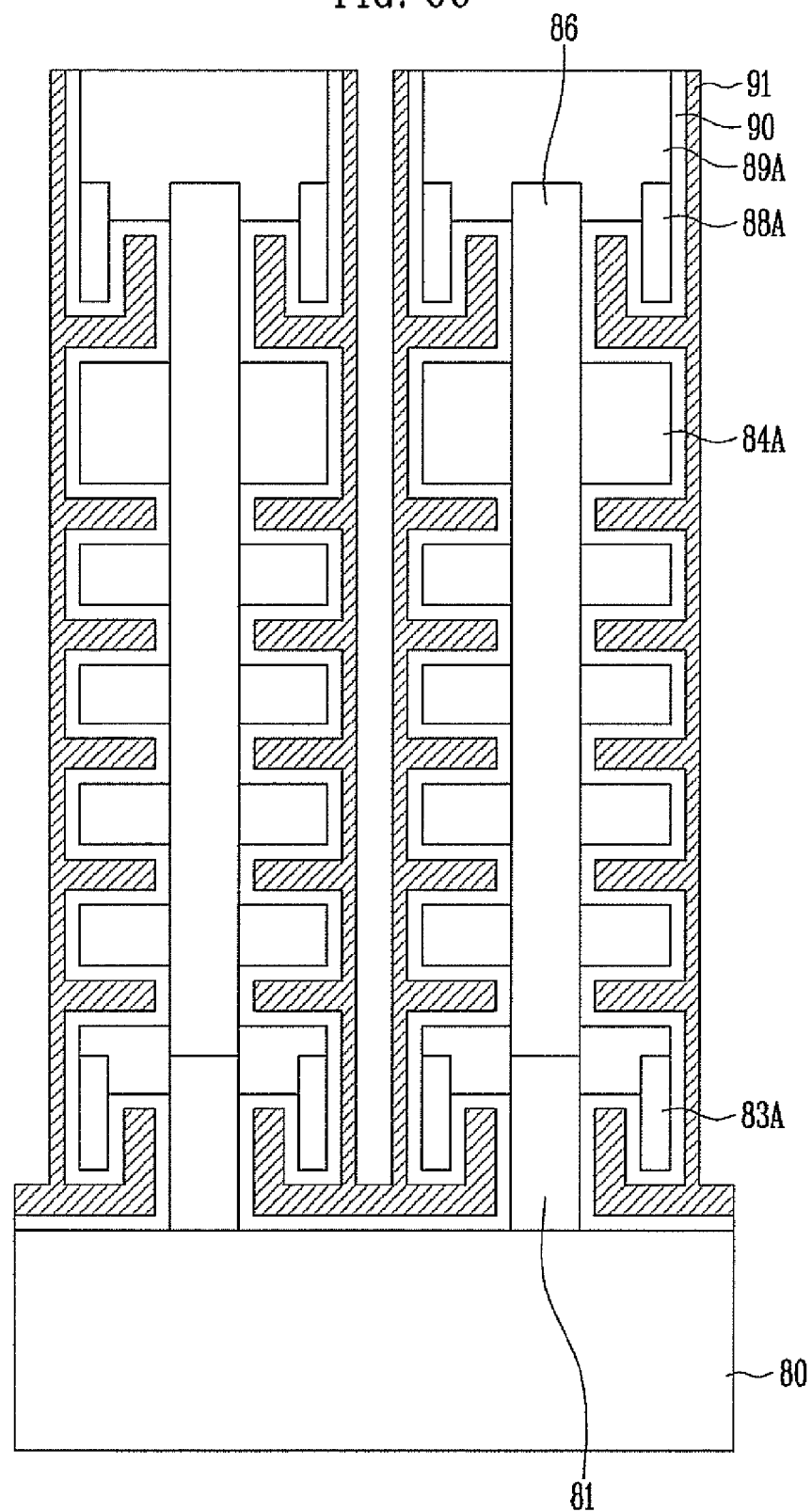

As shown in FIG. 6C, a charge blocking layer, a charge trap layer, and a tunnel insulating layer, collectively denoted by reference numeral 90, are formed over the entire surface of the resulting structure in which the plurality of first gate regions each having an L shape, the plurality of word line regions, and the plurality of second gate regions each having an L shape are formed. A conductive layer 91 is formed on the entire surface of the resulting structure in which the charge blocking layer, the charge trap layer, and the tunnel insulating layer 90 are formed to fill the plurality of first gate regions each having an L shape, the plurality of word line regions, and the plurality of second gate regions each having an L shape. The conductive layer 91 may be a polysilicon layer or a metal layer.

Figure 6D:
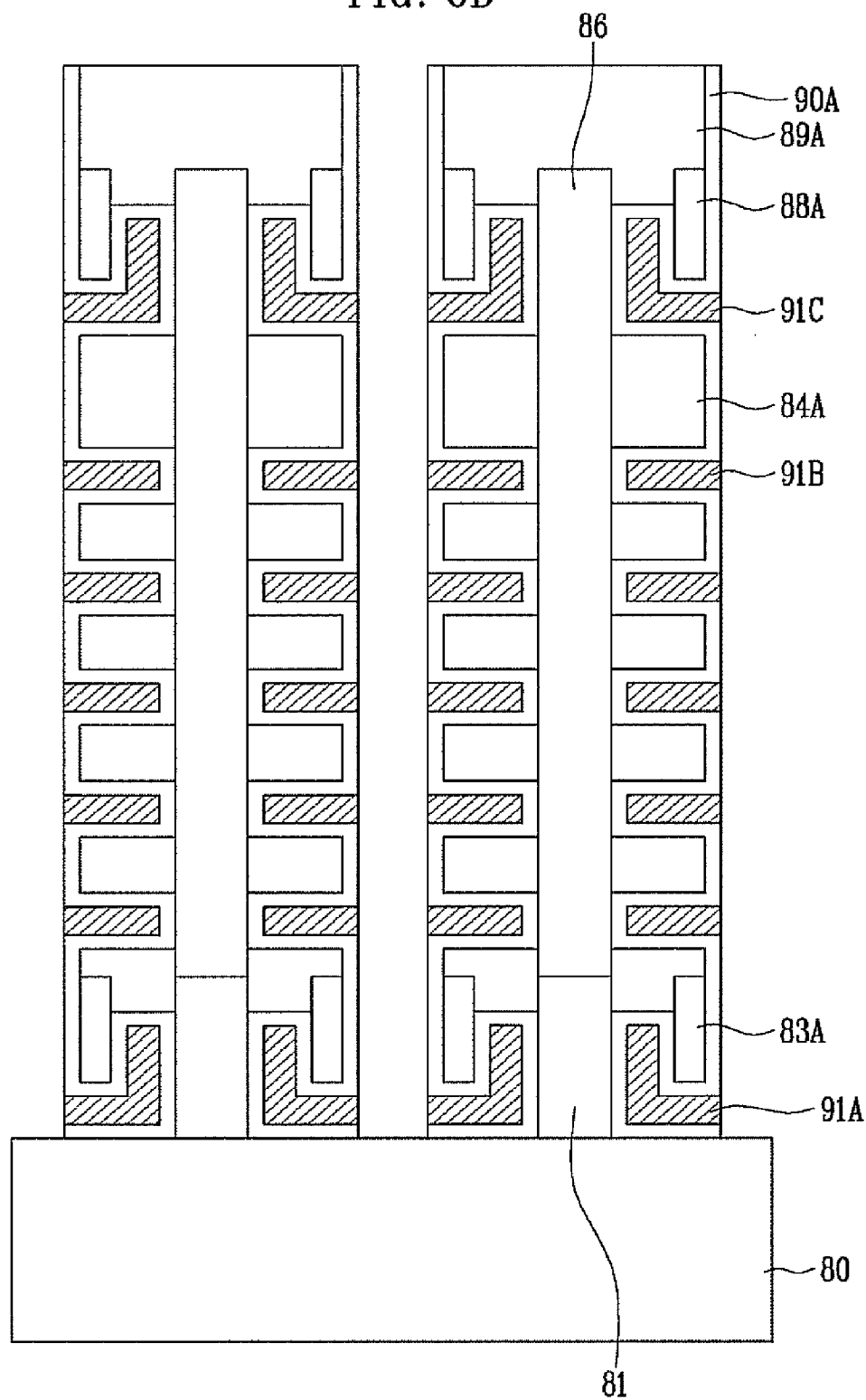

As shown in FIG. 6D, the conductive layer 91 formed on the inner walls of the plurality of first slits is etched so that the plurality of first gates each having an L shape, the plurality of word lines, and the plurality of second gates each having an L shape are separated from one another.

Thus, a plurality of first gates 91A each having an L shape, a plurality of word lines 91B, and a plurality of second gates 91C each having an L shape are formed.

If the conductive layer 91 is a polysilicon layer, the plurality of first gates 91A each having an L shape, the plurality of word lines 91B, and the plurality of second gates 91C each having an L shape which are exposed through the inner walls of the plurality of first slits may be silicidized.

In accordance with the third embodiment, the threshold voltages of lower selection transistors and upper selection transistors may be easily controlled because the impurities are doped onto the tops of the first channels 81 and the tops of the second channel 86. Furthermore, since the first gates 91A each having an L shape and the second gates 91C each having an L shape are formed, the first gates 91A and the second gates 91C may be prevented from being fully removed in a process of separating the word lines from one another.

FIGS. 7A to 7F are cross-sectional views illustrating a method of manufacturing a 3-D non-volatile memory device according to a fourth embodiment of this disclosure.

Figure 7A:
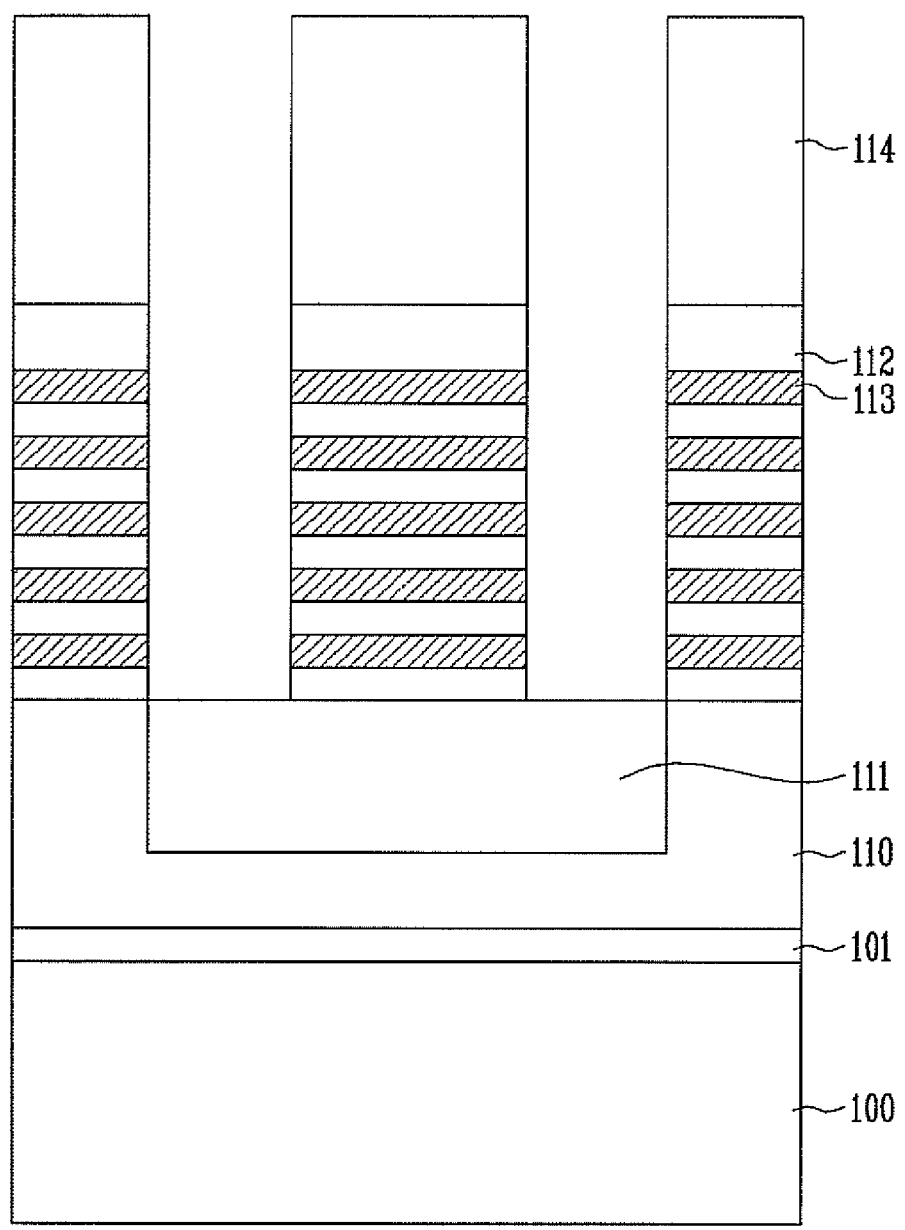
FIGS. 7A to 7F are cross-sectional views illustrating a method of manufacturing a 3-D non-volatile memory device according to a fourth embodiment of this disclosure.

As shown in FIG. 7A, after an insulating layer 101 is formed on a substrate 100, a conductive layer 110 is formed on the insulating layer 101. The conductive layer 110 is used to form the gates of pipe transistors and may be a polysilicon layer into which N type impurities have been doped.

After forming first trenches by etching the conductive layer 110, a first sacrificial layer 111 is filled in the first trenches. The first sacrificial layer 111 may be a nitride layer. Each of the first trenches is used to form the pipe channel of a U-shaped channel.

A plurality of first interlayer insulating layers 112 and a plurality of first conductive layers 113 are alternately formed over the resulting structure in which the first sacrificial layer 111 is filled. It is preferred that the number of each of the first interlayer insulating layers 112 and the first conductive layers 113 be determined by taking the number of memory cells to be stacked along the U-shaped channel into consideration. The first conductive layer 113 is used to form a word line and may be a polysilicon layer.

A buffer layer 114 is formed over the plurality of first interlayer insulating layers 112 and the plurality of first conductive layers 113.

Figure 7B:
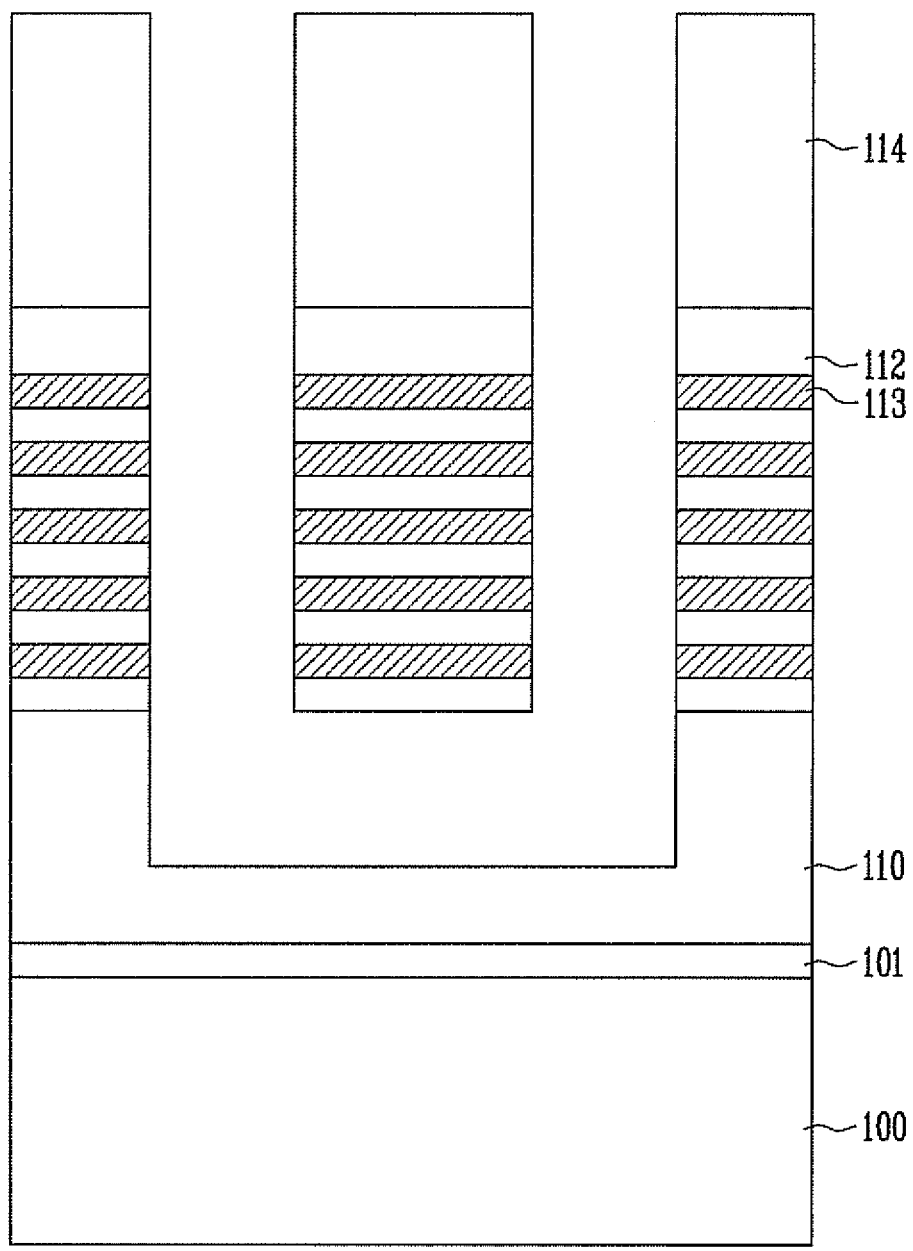

As shown in FIG. 7B, second trenches coupled to the first trenches are formed by etching the buffer layer 114, the plurality of first interlayer insulating layers 112 and the plurality of first conductive layers 113. At least two of second trenches may be coupled to each of the first trenches to form a U or W shaped trench. The second trenches are used to form the first channels of the U-shaped channel. It is preferred that a pair of the first channels be included in one U-shaped channel. For example, the pair of second trenches may be formed to expose the surface of the first sacrificial layer 111 filled in the first trenches, so that the pair of second trenches form a U shape trench with the first trench.

The first sacrificial layer 111 exposed through the bottoms of the pair of second trenches is removed.

Figure 7C:
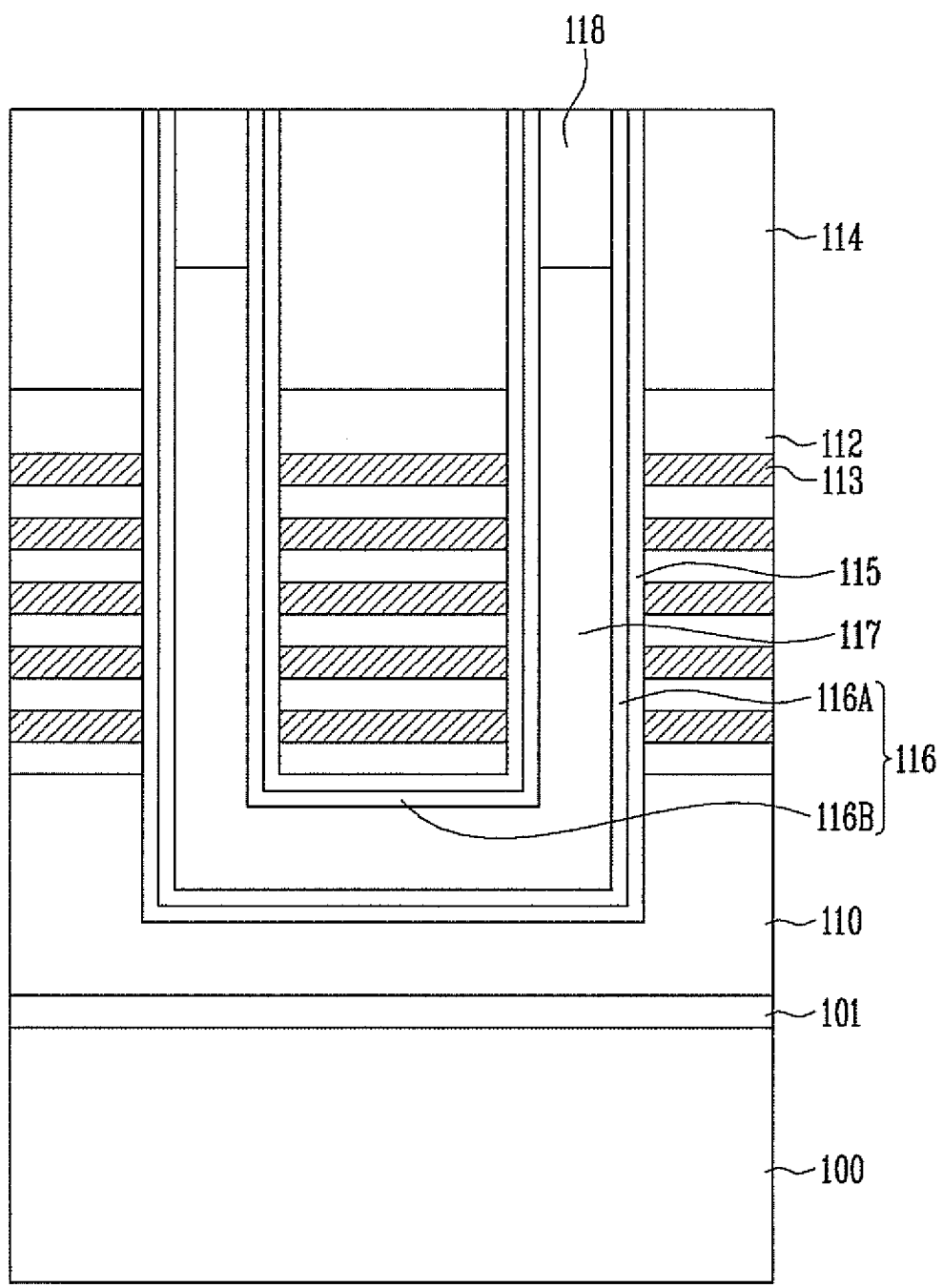

As shown in FIG. 7C, a charge blocking layer, a charge trap layer, and a tunnel insulating layer, collectively denoted by reference numeral 115, are formed on the inner surfaces of the first trench and the pair of second trenches. A channel layer 116 having a central region penetrated is formed on the charge blocking layer, the charge trap layer, and the tunnel insulating layer 115. Accordingly, a pipe channel 116B formed in the first trench and a pair of first channels 116A formed in the pair of second trenches form the U-shaped channel. The pipe channel 116B is coupled to the bottoms of the pair of first channels 116A.

An insulating layer 117 is filled in the central region of the U-shaped channel. The insulating layer 117 is recessed by a specific depth, and conductive plugs 118 are formed within the recessed regions.

Figure 7D:
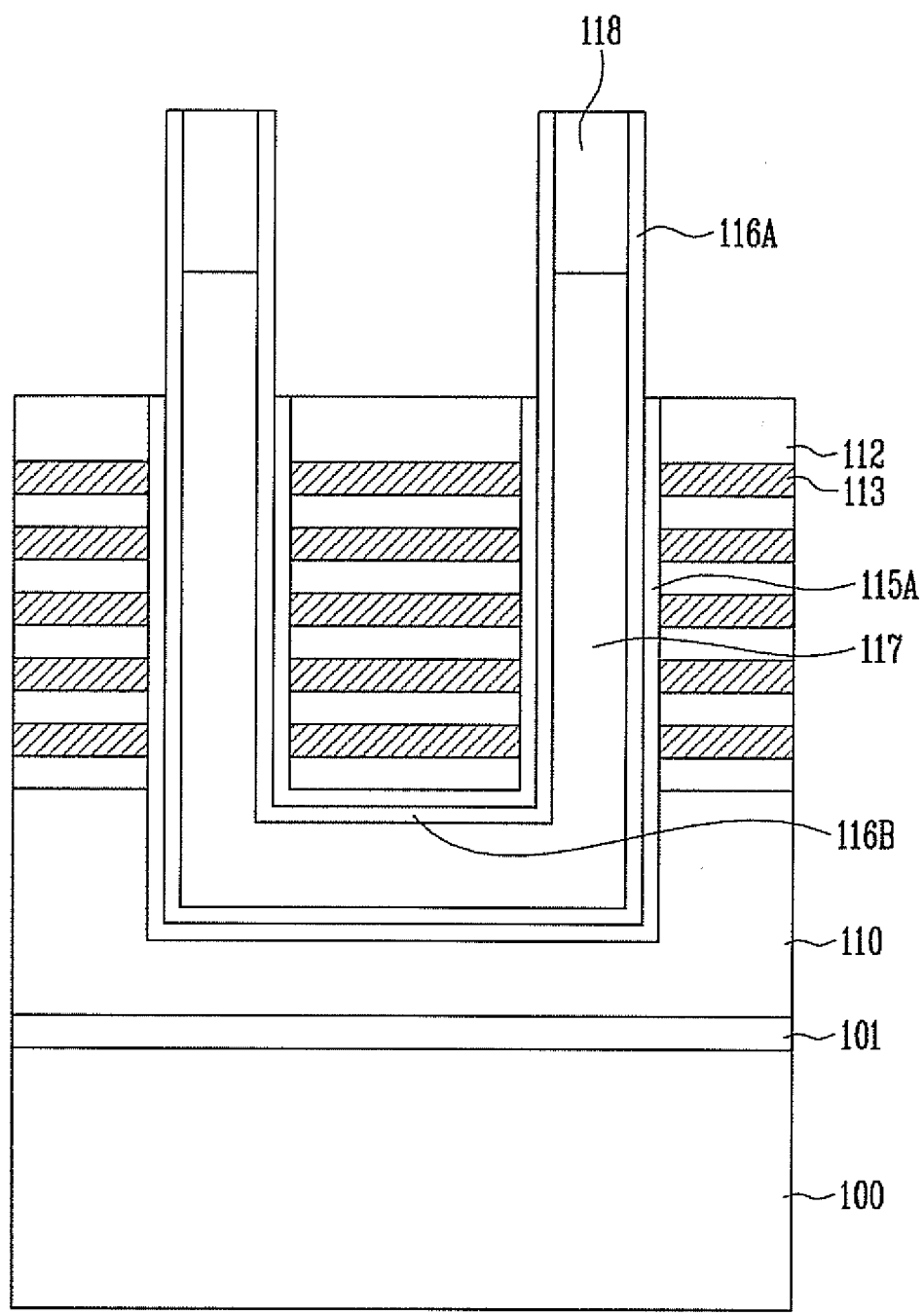

As shown in FIG. 7D, after removing the buffer layer 114, the charge blocking layer, the charge trap layer, and the tunnel insulating layer 115 surrounding each of the upper sidewalls of the plurality of first channels 116A are removed. In FIG. 7D, the remaining charge blocking layer, the remaining charge trap layer, and the remaining tunnel insulating layer are collectively denoted by reference numeral '115A'.

Impurities are doped onto the tops and sidewalls of the plurality of first channels 116A exposed after removing the charge blocking layers, the charge trap layers, and the tunnel insulating layers 115. The impurities may also be doped into the conductive plugs 118.

Figure 7E:
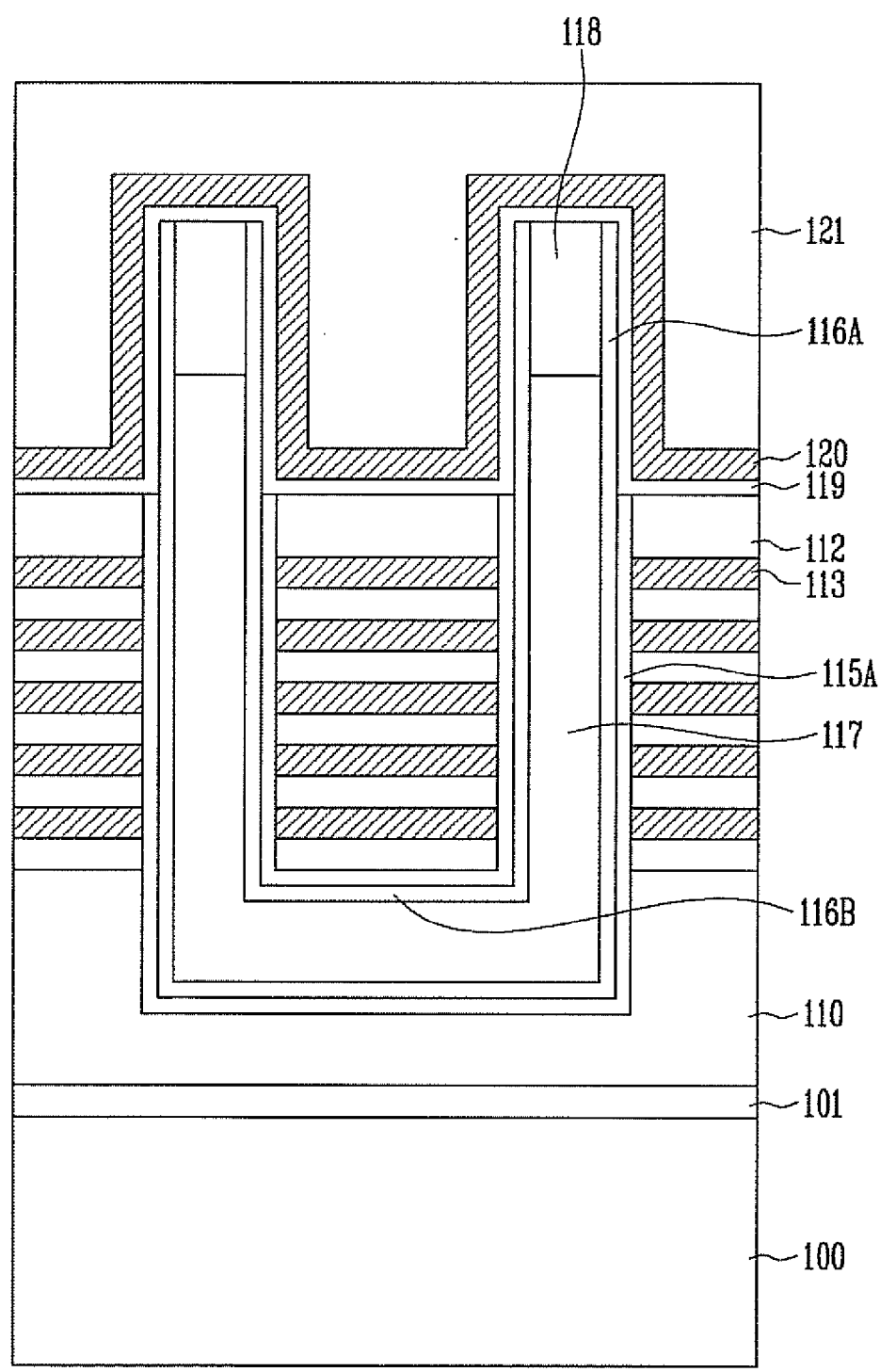

As shown in FIG. 7E, a gate insulating layer 119 and a second conductive layer 120 are formed over the entire surface of the resulting structure into which the impurities are doped. A second interlayer insulating layer 121 is formed on the second conductive layer 120.

Figure 7F:
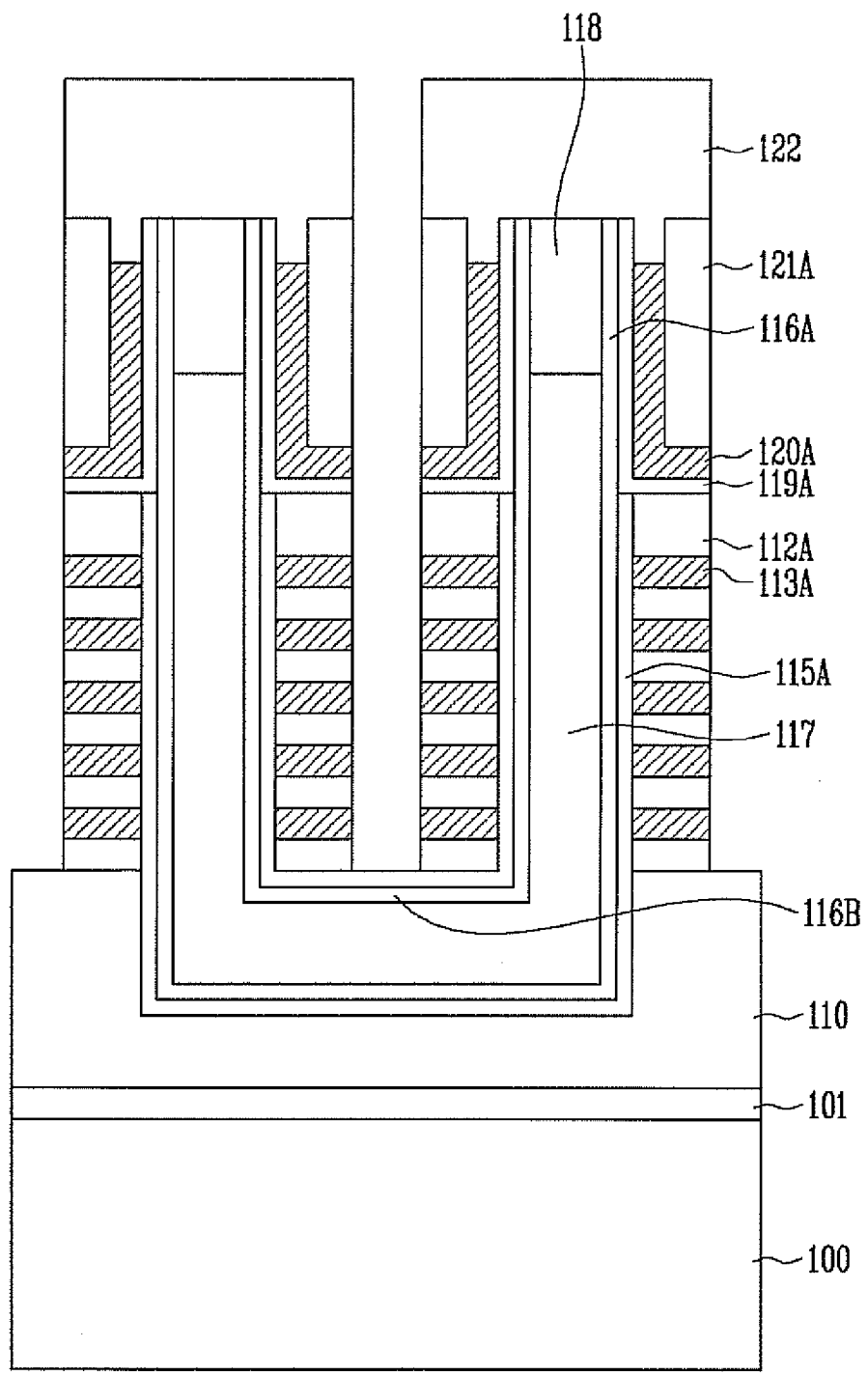

As shown in FIG. 7F, a planarization process is performed until the top surfaces of the plurality of first channels 116A or the top surfaces of the conductive plugs 118 are exposed. The second conductive layers 120 exposed on the top of the planarized result are recessed by a specific depth.

A third interlayer insulating layer 122 is formed on the entire surface of the recessed result. The third interlayer insulating layer 122, the second interlayer insulating layer 121, the second conductive layer 120, the gate insulating layer 119, the plurality of first interlayer insulating layers 112, and the plurality of first conductive layers 113 between the first channels 116A that are adjacent to each other are etched to form a plurality of gates 120A each having an L shape. Here, the plurality of gates 120A include regions extending in parallel and coupling the first channels arranged in a specific direction. Furthermore, a plurality of word lines 113A are separated from one another. A pair of the gates 120A formed on one string may form a drain selection line and a source selection line.

In FIG. 7F, the etched second interlayer insulating layer is denoted by reference numeral '121A', the etched gate insulating layer is denoted by reference numeral '119A', and the plurality of etched first interlayer insulating layers are denoted by reference numeral '112A'.

The plurality of word lines 113A and the plurality of gates 120A exposed through the etched surface may be silicidized.

In accordance with the fourth embodiment, the threshold voltages of lower selection transistors and upper selection transistors may be easily controlled because the impurities are doped onto the tops and sidewalls of the first channels 116A. Furthermore, since the source selection gates each having an L shape and the drain selection gates each having an L shape are formed, the source selection gates and the drain selection gates may be prevented from being fully removed in a process of separating the word lines from one another. In addition, the gate insulating layer 119A of the source selection transistor and the drain selection transistor may be formed of an oxide layer.

FIGS. 8A to 8G are cross-sectional views illustrating a method of manufacturing a 3-D non-volatile memory device according to a fifth embodiment of this disclosure.

Figure 8A:
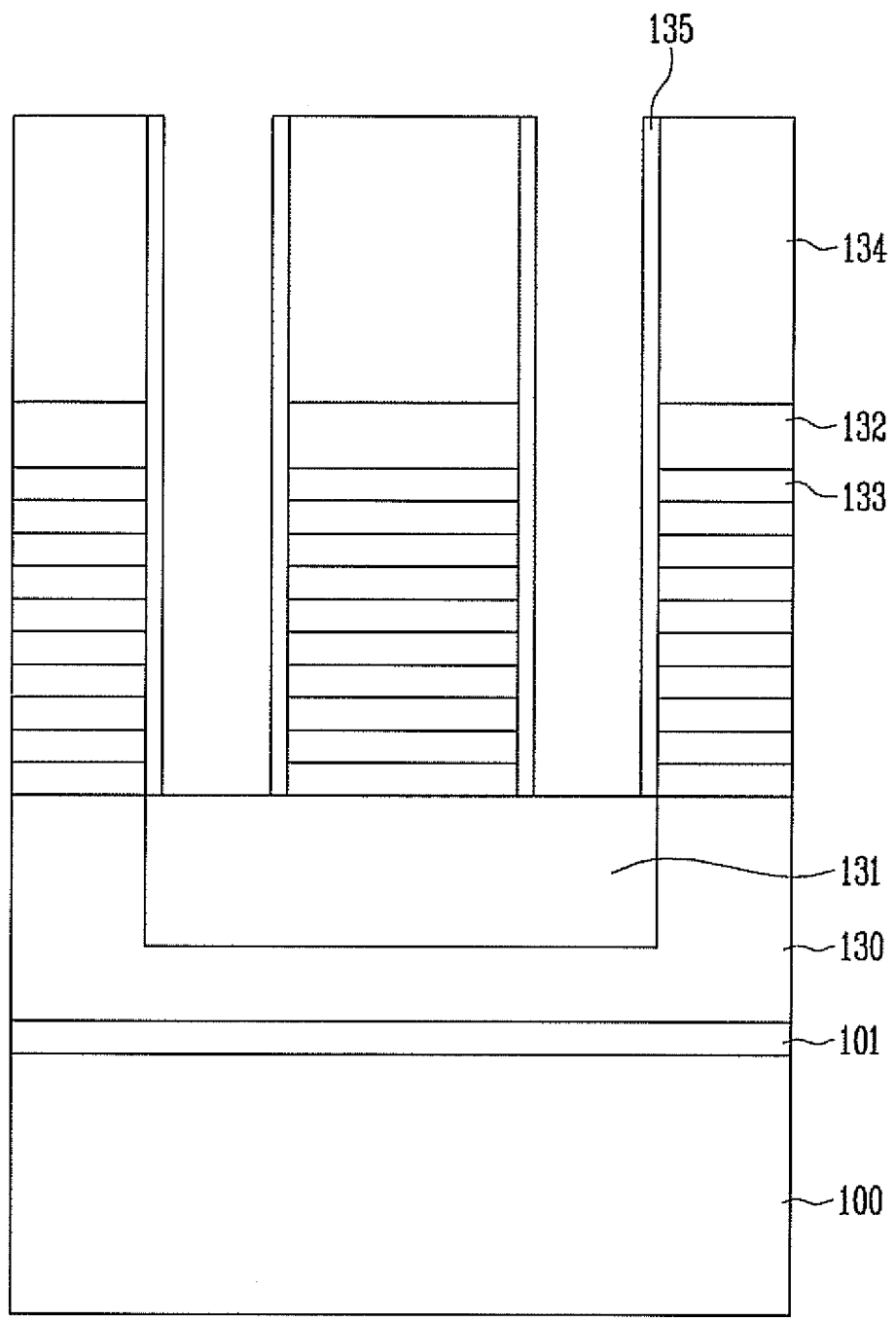
FIGS. 8A to 8G are cross-sectional views illustrating a method of manufacturing a 3-D non-volatile memory device according to a fifth embodiment of this disclosure.

As shown in FIG. 8A, after an insulating layer 101 is formed on a substrate 100, a conductive layer 130 is formed on the insulating layer 101. First trenches are formed by etching the conductive layer 130, and a first sacrificial layer 131 is filled in the first trenches.

A plurality of first interlayer insulating layers 132 and a plurality of second sacrificial layers 133 are alternately formed over the resulting structure in which the first sacrificial layer 131 is filled. The second sacrificial layer 133 is used to secure regions where word lines will be formed in a subsequent process and may be a nitride layer.

A buffer layer 134 is formed over the plurality of first interlayer insulating layers 132 and the plurality of second sacrificial layers 133. A pair of second trenches coupled to each of the first trenches is formed by etching the buffer layer 134, the plurality of first interlayer insulating layers 132, and the plurality of second sacrificial layers 133.

A passivation layer 135 is formed on the inner walls of the pair of second trenches. The first sacrificial layer 131 exposed through the bottoms of the pair of second trenches is removed. The passivation layer 135 functions to prevent the plurality of second sacrificial layers 133 from being removed when removing the first sacrificial layer 131. The passivation layer 135 may be a TiN layer.

Figure 8B:
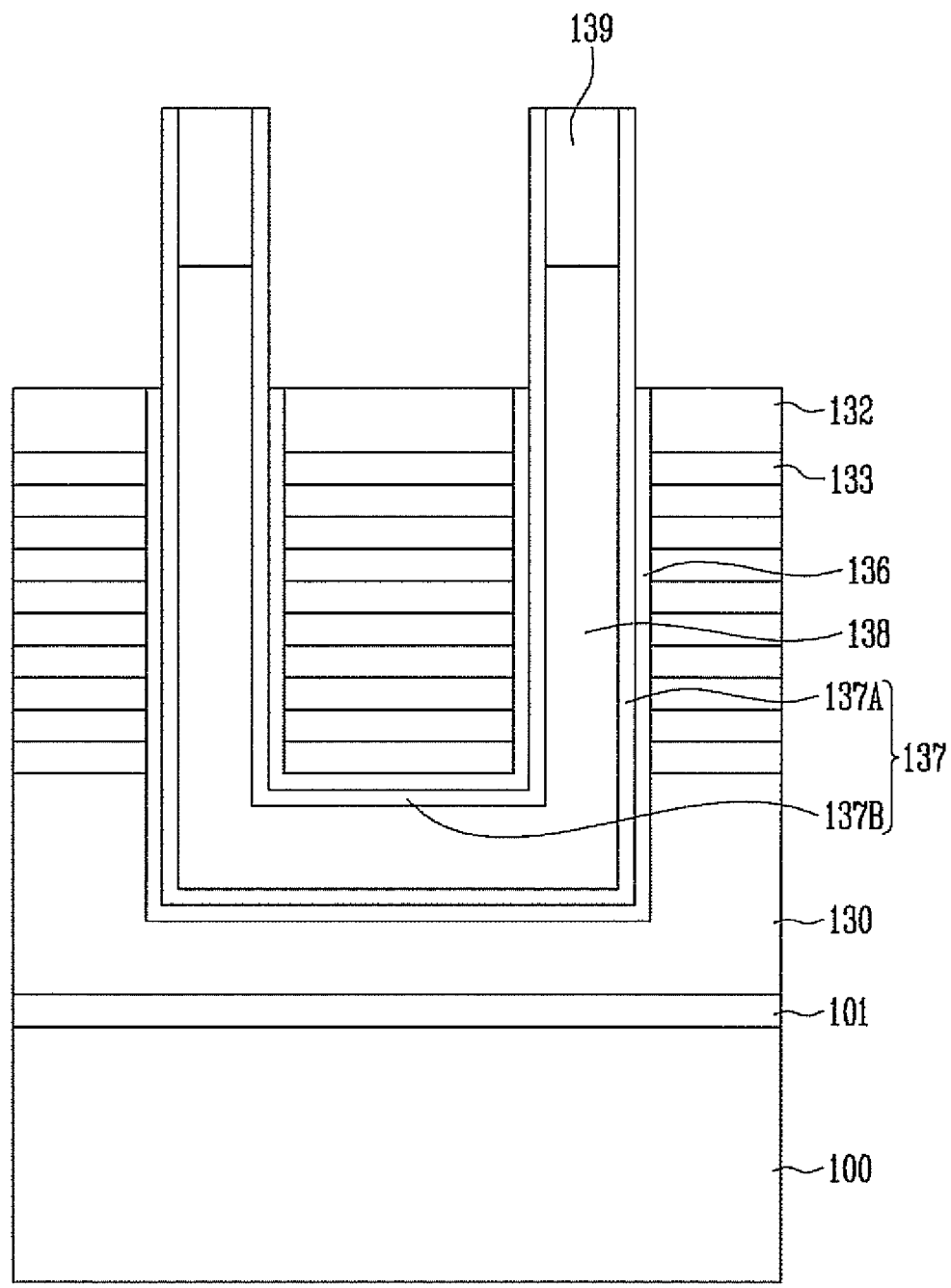

As shown in FIG. 8B, after the passivation layer 135 is removed, a charge blocking layer, a charge trap layer, and a tunnel insulating layer, collectively denoted by 136, are formed on the inner surfaces of the first trench and the pair of second trenches. A channel layer 137 having a central region penetrated is formed on the charge blocking layer, the charge trap layer, and the tunnel insulating layer 136. Thus, a pipe channel 137B formed in the first trench and a pair of first channels 137A formed in the pair of second trenches form a U-shaped channel 137.

An insulating layer 138 is filled in the central region of the U-shaped channel 137. The insulating layer 138 is recessed by a specific depth, and conductive plugs 139 are formed in the recessed regions.

After removing the buffer layer 134, the charge blocking layers, the charge trap layers, and the tunnel insulating layers 136 formed to surround the upper sidewalls of the plurality of first channels 137A are removed. Impurities are doped onto the tops and sidewalls of the plurality of first channels 137A exposed after removing the charge blocking layers, the charge trap layers, and the tunnel insulating layers 136.

Figure 8C:
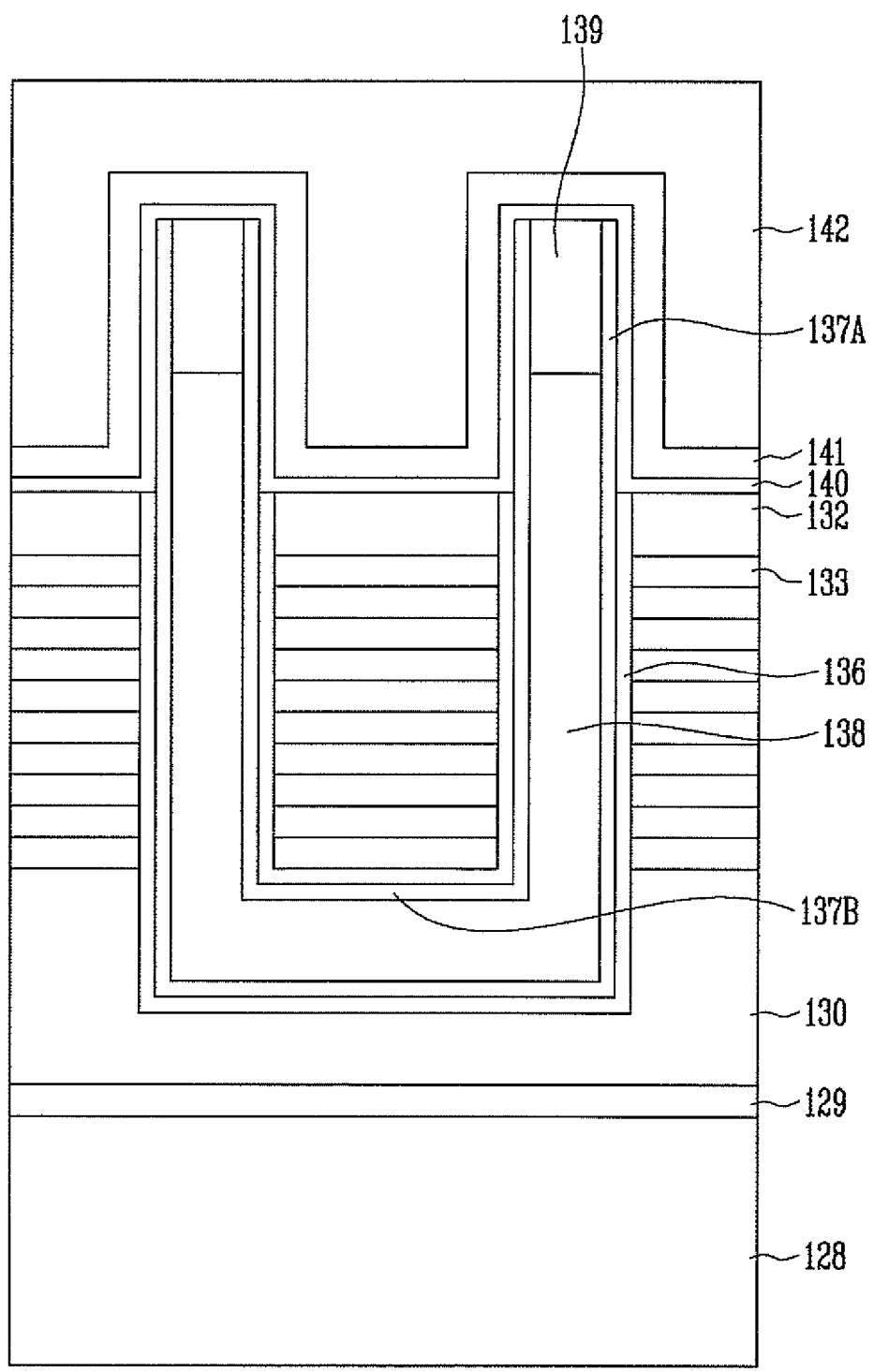

As shown in FIG. 8C, a gate insulating layer 140 and a third sacrificial layer 141 are formed over the entire surface of the resulting structure in which the impurities have been doped. A second interlayer insulating layer 142 is formed on the third sacrificial layer 141.

Figure 8D:
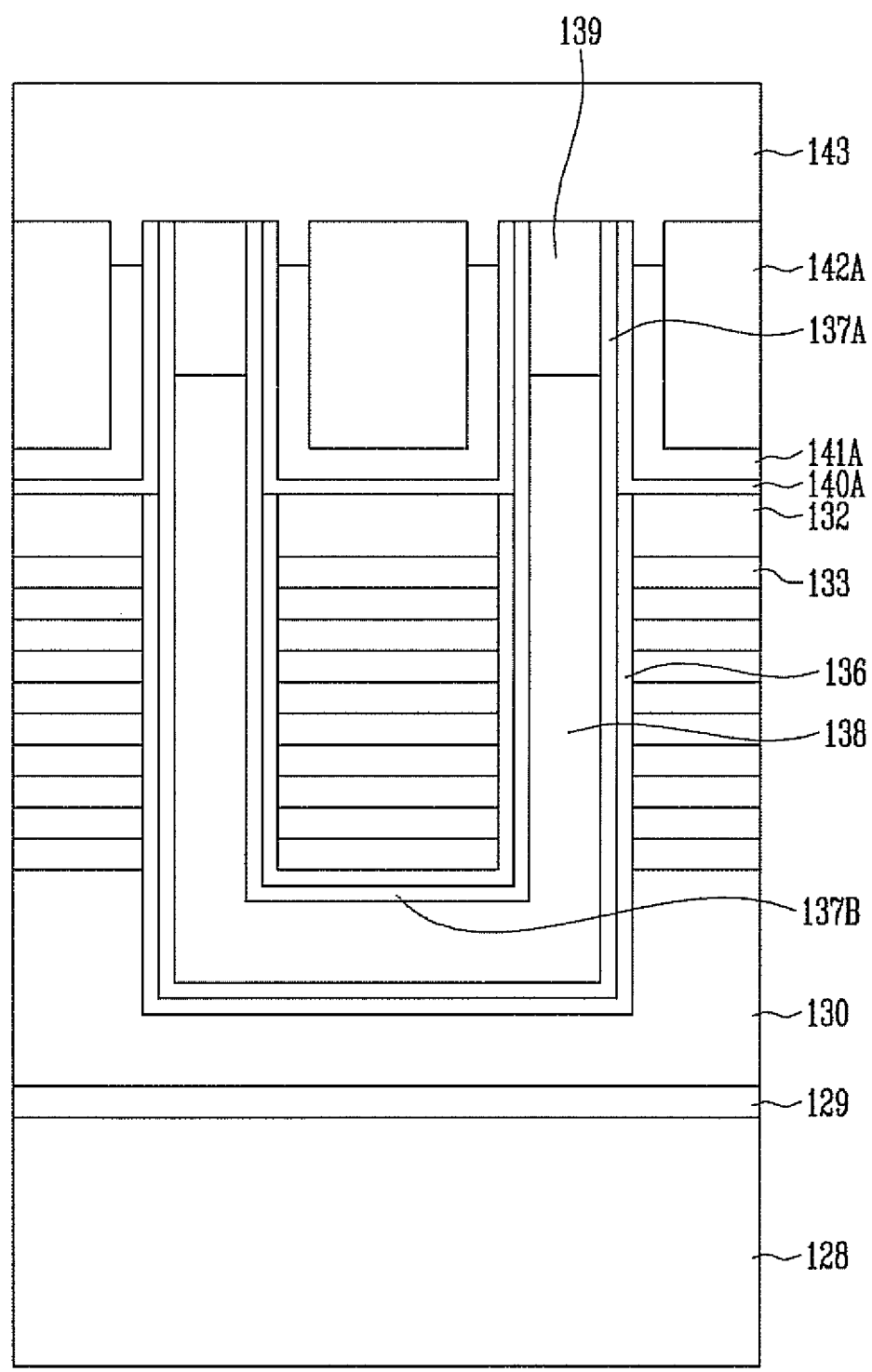

As shown in FIG. 8D, a planarization process is performed until the top surfaces of the plurality of first channels 137A or the top surfaces of the conductive plugs 139 are exposed. The third sacrificial layers 141 exposed on the top of the planarized result are recessed by a specific depth. In FIG. 8D, the recessed third sacrificial layer is denoted by reference numeral '141A'.

A third interlayer insulating layer 143 is formed on the entire surface of the recessed result.

Figure 8E:
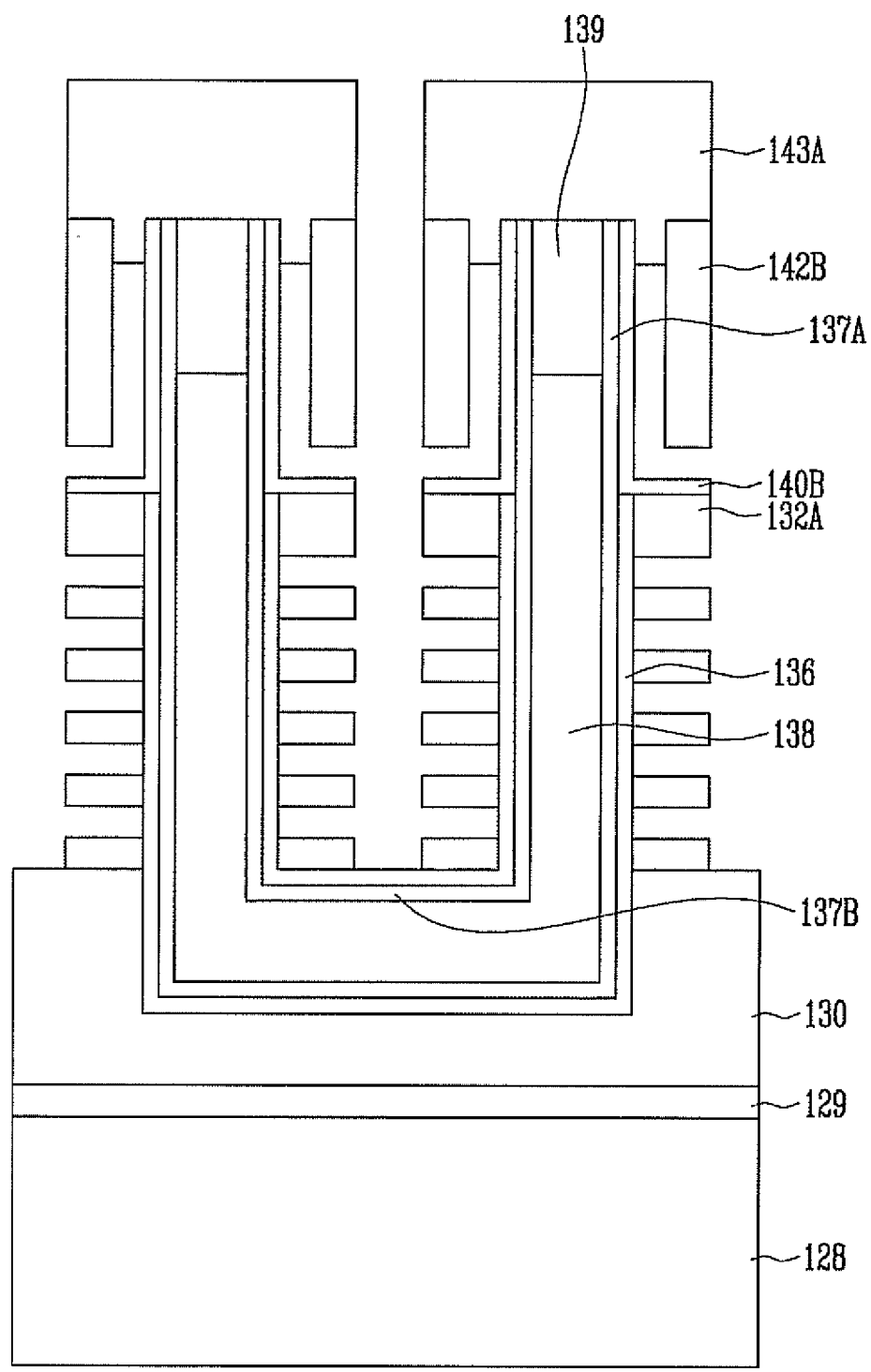

As shown in FIG. 8E, a plurality of first slits are formed by etching the third interlayer insulating layer 143, the second interlayer insulating layer 142A, the third sacrificial layer 141A, the gate insulating layer 140A, the plurality of first interlayer insulating layers 132, and the plurality of second sacrificial layers 133 between the first channels 137A that are adjacent to each other.

A plurality of gate regions each having an L shape and a plurality of word line regions are formed by removing the plurality of second sacrificial layers 133 and the third sacrificial layer 141A exposed through the inner walls of the plurality of first slits.

Figure 8F:
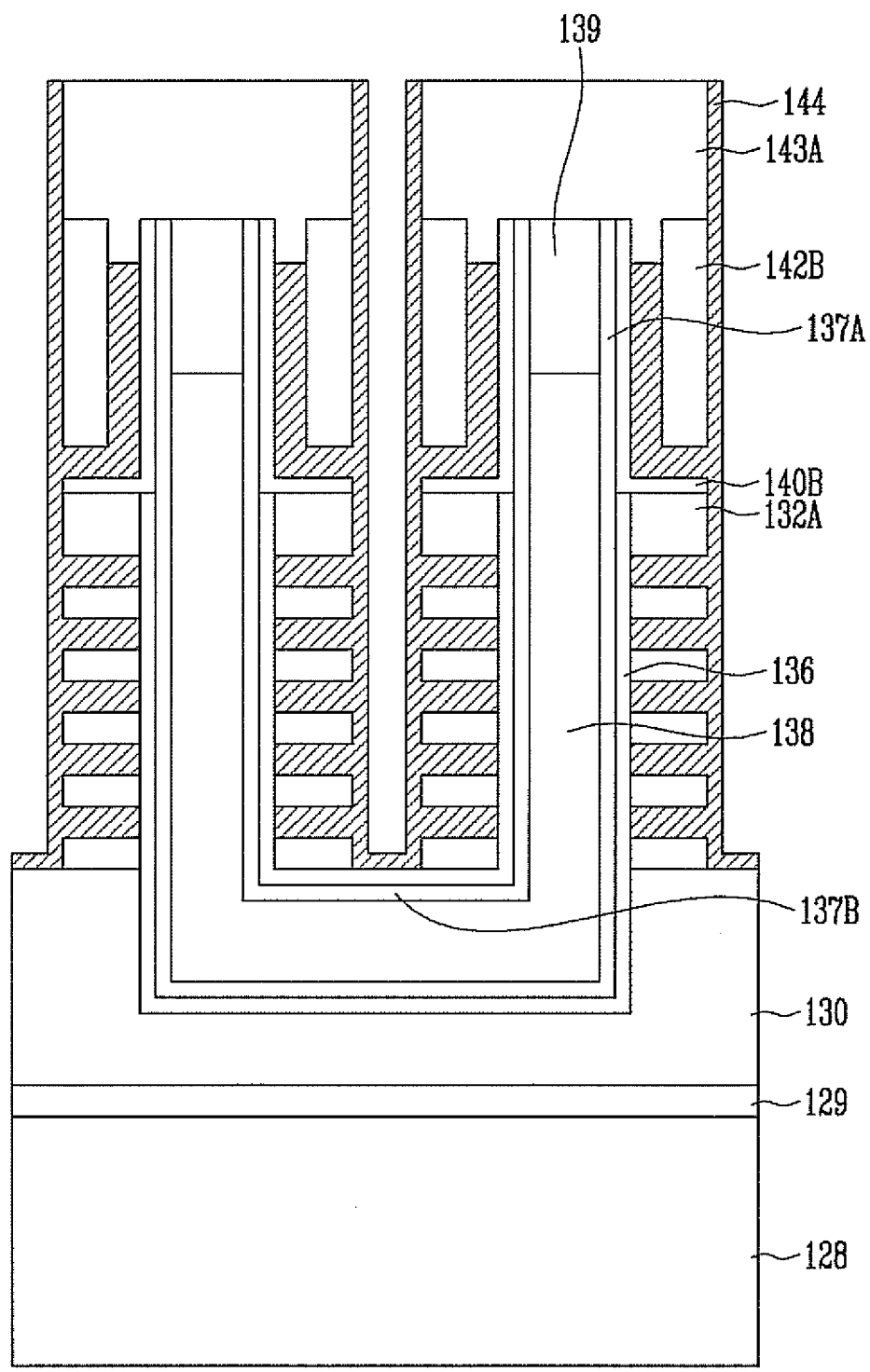

As shown in FIG. 8F, a conductive layer 144 is formed to fill the plurality of gate regions each having an L shape and the plurality of word line regions. The conductive layer 144 may be a polysilicon layer or a metal layer.

Figure 8G:
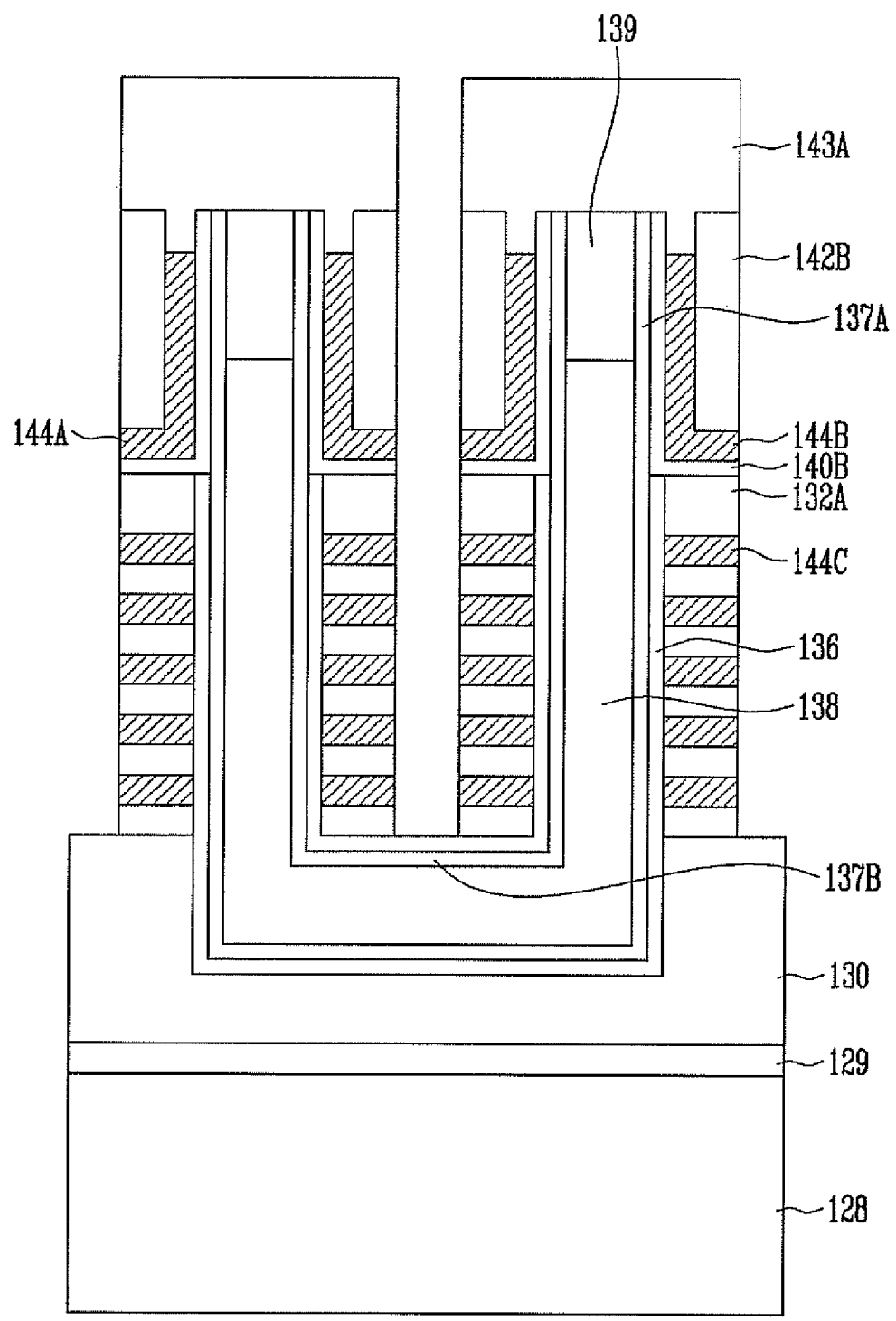

As shown in FIG. 8G, the conductive layer 144 formed on the inner walls of the plurality of first slits is etched so that the plurality of gates each having an L shape and the plurality of word lines are separated from one another.

Thus, a plurality of drain selection gates 144A each having an L shape, a plurality of source selection gates 144B each having an L shape, and a plurality of word lines 144C are formed.

If the conductive layer 144 is a polysilicon layer, the plurality of drain selection gates 144A each having an L shape, the plurality of source selection gates 144B each having an L shape, and the plurality of word lines 144C exposed through the inner walls of the plurality of first slits may be silicidized.

In accordance with the fifth embodiment, the threshold voltages of drain selection transistors and source selection transistors may be easily controlled because the impurities are doped onto the upper ends of the first channels 137A. Furthermore, since the drain selection gates 144A each having an L shape and the source selection gates 144B each having an L shape are formed, the drain selection gates 144A and the source selection gates 144B may be prevented from being fully removed in a process of separating the word lines from one another. Furthermore, the gate insulating layer 140B forming the source selection transistors and the drain selection transistors may be formed of an oxide layer.

FIGS. 9A to 9E are cross-sectional views illustrating a method of manufacturing a 3-D non-volatile memory device according to a sixth embodiment of this disclosure.

Figure 9A:
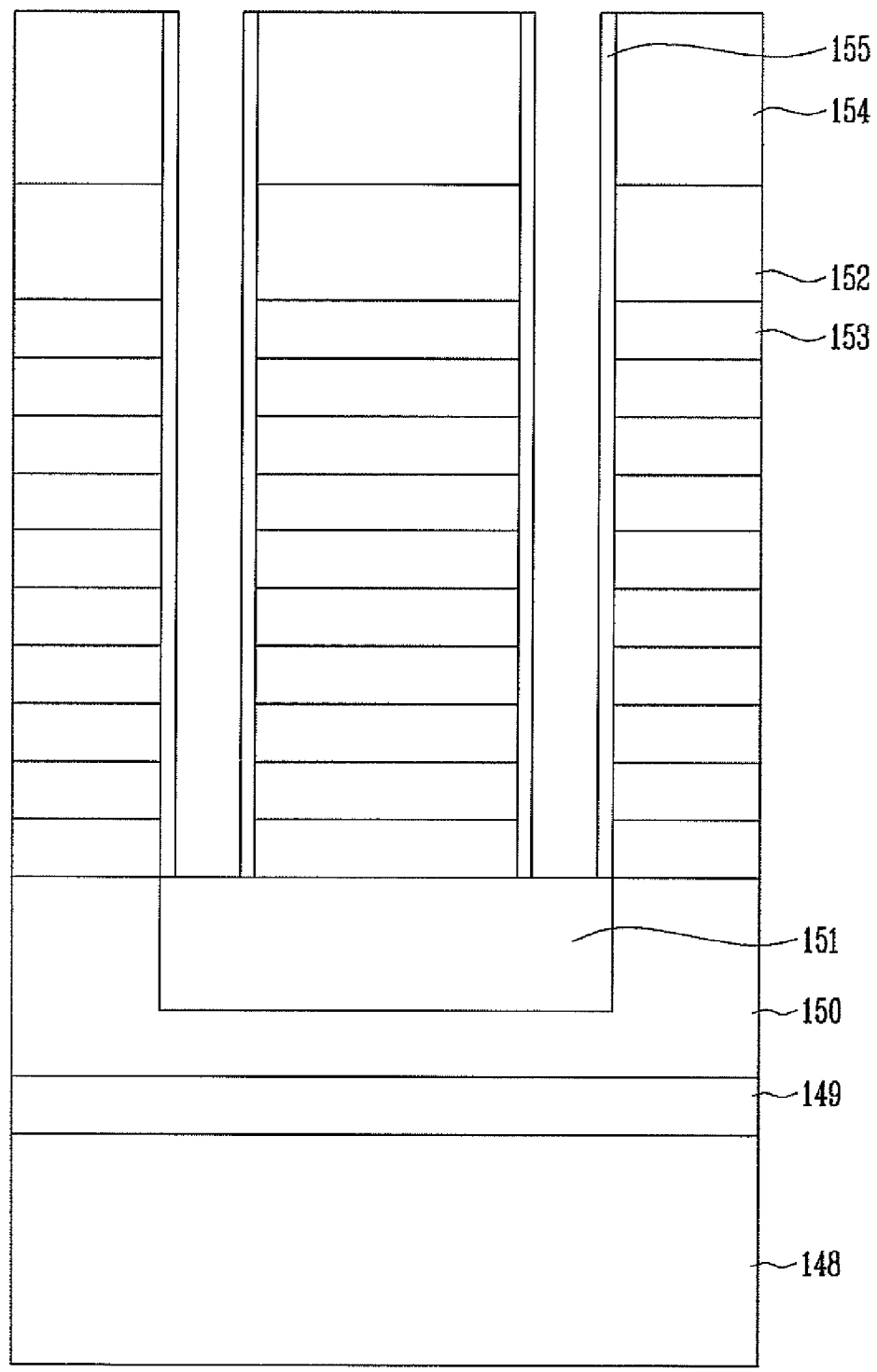

As shown in FIG. 9A, after forming an insulating layer 149 on a substrate 148, a conductive layer 150 is formed on the insulating layer 149. First trenches are formed by etching the conductive layer 150, and a first sacrificial layer 151 is formed in the first trenches. A plurality of first interlayer insulating layers 152 and a plurality of second sacrificial layers 153 are alternately formed over the resulting structure in which the first sacrificial layer 151 is filled.

A buffer layer 154 is formed over the plurality of first interlayer insulating layers 152 and the plurality of second sacrificial layers 153. A pair of second trenches coupled to each of the first trenches is formed by etching the buffer layer 154, the plurality of first interlayer insulating layers 152, and the plurality of second sacrificial layers 153.

After forming a passivation layer 155 on the inner walls of the pair of second trenches, the first sacrificial layer 151 exposed through the bottoms of the pair of second trenches is removed.

As shown in FIG. 9B, after removing the passivation layer 155, a channel layer 156 having a central region penetrated is formed on the inner surfaces of the first trench and the pair of second trenches. Accordingly, a pipe channel 156B formed in the first trench and the pair of first channels 156A formed in the pair of second trenches form a U-shaped channel 156.

An insulating layer 157 is filled in the central region of the U-shaped channel 156. The insulating layer 157 is recessed by a specific depth, and conductive plugs 158 are formed in the recessed regions. Next, after removing the buffer layer 154, impurities are doped onto the exposed tops and sidewalls of the plurality of first channels 156A.

A third sacrificial layer 159 is formed on the entire surface of the resulting structure into which the impurities have been doped. A second interlayer insulating layer 160 is formed on the third sacrificial layer 159. Next, a planarization process is performed until the top surfaces of the plurality of first channels 156A or the top surfaces of the conductive plugs 158 are exposed. The third sacrificial layers 159 exposed on the top of the planarized result are recessed by a specific depth. A third interlayer insulating layer 161 is formed on the entire surface of the recessed result.

As shown in FIG. 9C, a plurality of first slits are formed by etching the third interlayer insulating layer 161, the second interlayer insulating layer 160, the third sacrificial layer 159, the plurality of first interlayer insulating layers 152, and the plurality of second sacrificial layers 153 between the first channels 156A that are adjacent to each other.

A plurality of gate regions each having an L shape and a plurality of word line regions are formed by removing the plurality of second sacrificial layers 153 and the third sacrificial layer 159 exposed on the inner walls of the plurality of first slits.

Figure 9D:
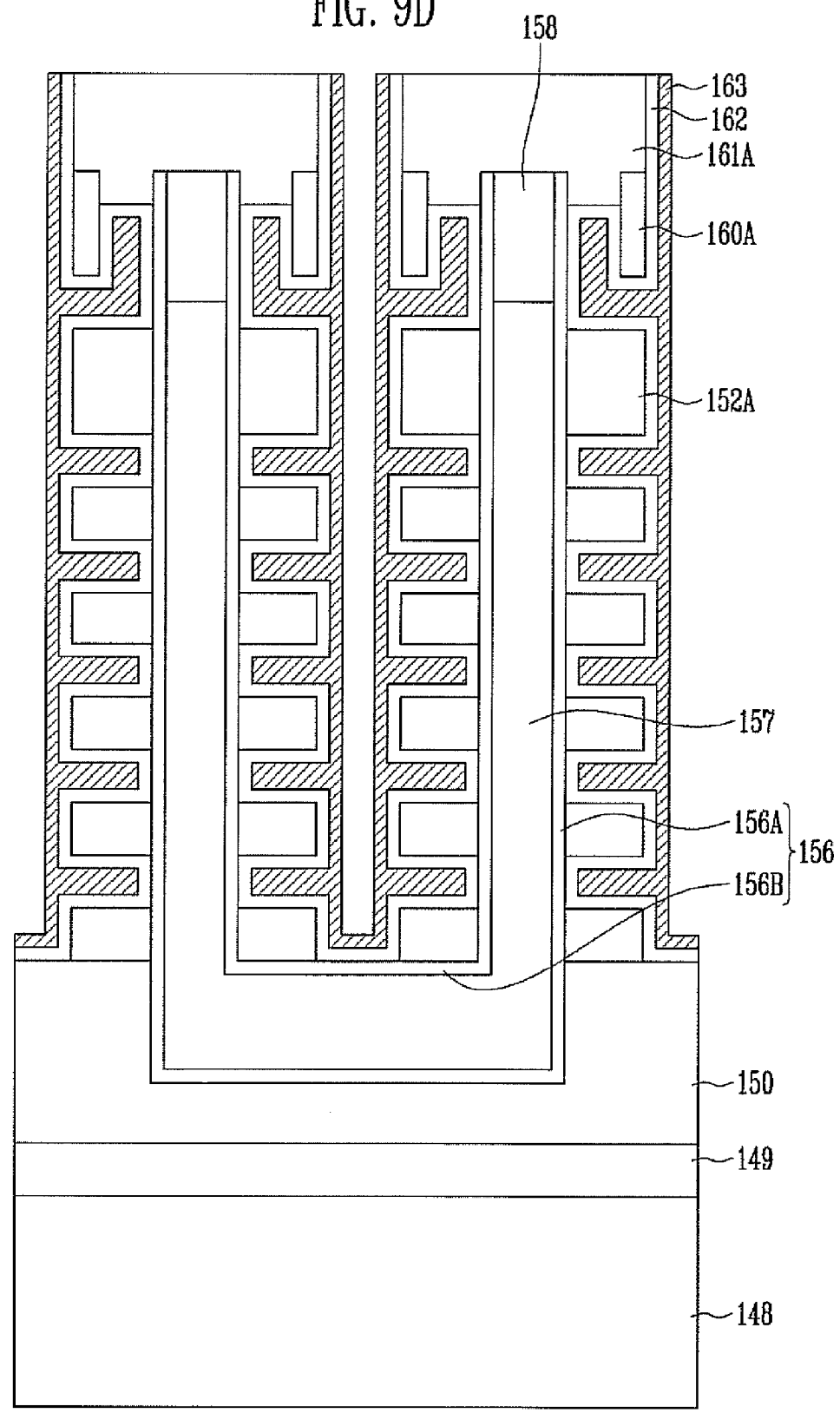

As shown in FIG. 9D, a charge blocking layer, a charge trap layer, and a tunnel insulating layer, collectively denoted by reference numeral 162, are formed on the entire surface of the resulting structure in which the plurality of gate regions each having an L shape and the plurality of word line regions are formed.

Next, a conductive layer 163 is formed to fill the plurality of gate regions each having an L shape and the plurality of word line regions. The conductive layer 163 may be a polysilicon layer or a metal layer.

Figure 9E:
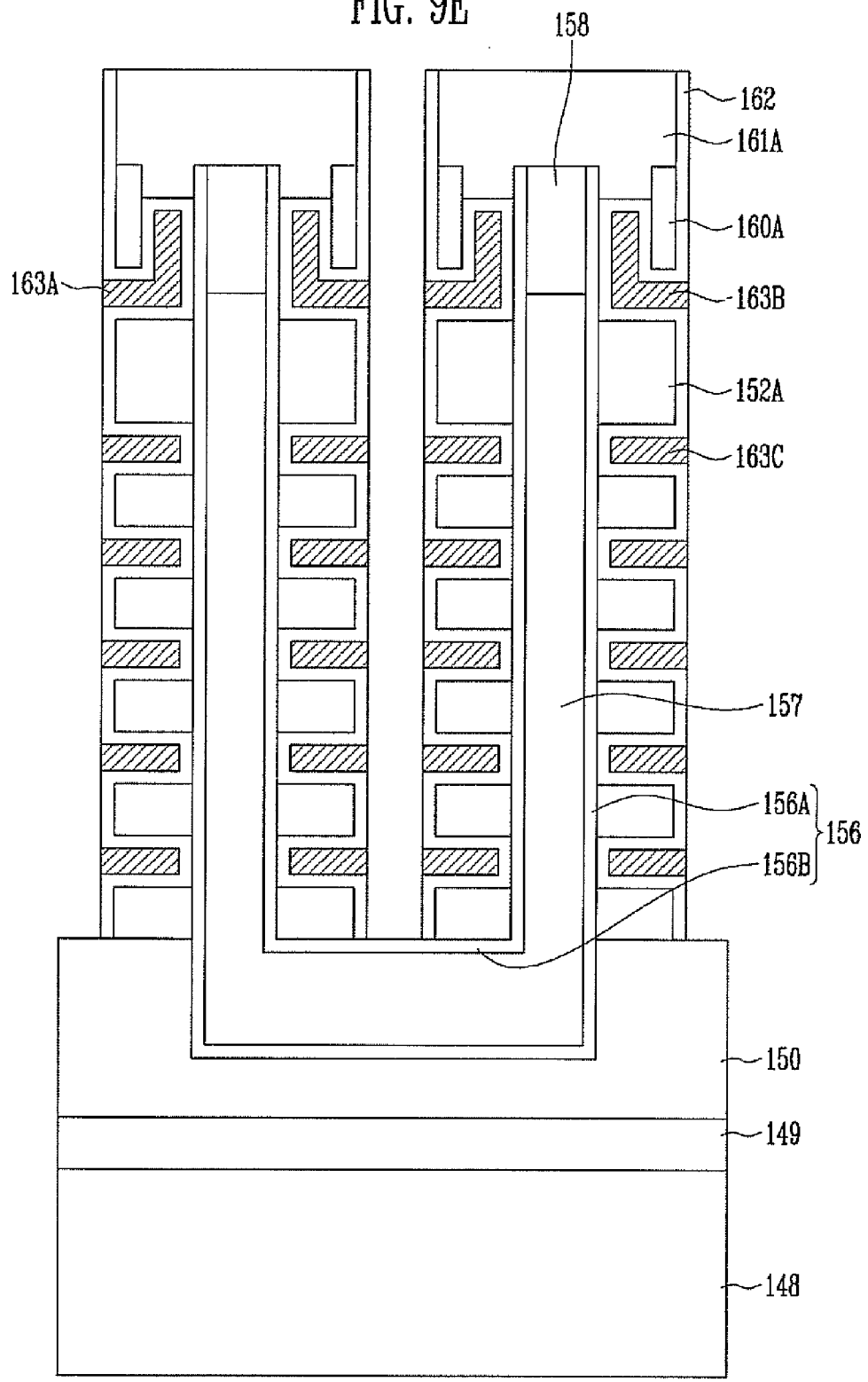

As shown in FIG. 9E, the conductive layer 163 formed on the inner walls of the plurality of first slits is etched so that the plurality of first gates each having an L shape and the plurality of word lines are separated from one another.

Accordingly, a plurality of drain selection gates 163A each having an L shape, a plurality of source selection gates 163B each having an L shape, and a plurality of word lines 163C are formed.

If the conductive layer 163 is a polysilicon layer, the plurality of drain selection gates 163A each having an L shape, the plurality of source selection gates 163B each having an L shape, and the plurality of word lines 163C exposed through the inner walls of the plurality of first slits may be silicidized.

In accordance with the sixth embodiment, the threshold voltages of lower selection transistors and upper selection transistors may be easily controlled because the impurities are doped onto the upper ends of the first channels 156A. Furthermore, since the drain selection gates 163A each having an L shape and the source selection gates 163B each having an L shape are formed, the drain selection gates 163A and the source selection gates 163B may be prevented from being fully removed in a process of separating the word lines from one another.

The 3-D non-volatile memory device according to this disclosure includes the gates, each having an L shape, on the sidewalls of the channels. Accordingly, selection gates may be prevented from being removed in an etch process for separating word lines from one another.

Furthermore, the threshold voltages of selection transistors may be controlled by doping impurities into the channels of the selection transistors.

Furthermore, RC delay may be improved by increasing an interval between a selection gate line and a word line.

What is claimed is:

1. A method of manufacturing a non-volatile memory device, the method comprising:
    forming first channels protruding from a substrate so that tops and sidewalls of the first channels are exposed over the substrate;
    doping impurities on the tops and the sidewalls of the first channels;

forming first gate insulating layers surrounding sidewalls of the first channels, respectively; and forming first selection gates, each of which has an L shape, on the sidewalls of the first channels on which the first gate insulating layers are formed, wherein each of the first selection gates includes a first region surrounding the sidewalls of the first channels and a second region protruding from the first region, wherein the impurities are doped on the first channels before the first gate insulating layers are formed.

2. The method of claim 1, wherein the forming of the first selection gates comprises:

forming a first conductive layer on an entire surface of a structure in which the first gate insulating layer is formed;

forming a first interlayer insulating layer on the first conductive layer;

performing a planarization process until top surfaces of the first channels are exposed;

recessing the first conductive layer exposed through the planarization process; and forming the first selection gates by etching the first interlayer insulating layer, the first conductive layer, and the first gate insulating layers between neighboring first channels of the first channels.

3. The method of claim 1, further comprising silicidizing the first selection gates after the forming of the first selection gates.

4. The method of claim 1, wherein forming the first channels comprising:

etching pipe gates to form first trenches;

forming a second sacrificial layer in the first trenches;

alternately forming second interlayer insulating layers and second conductive layers over a structure in which the second sacrificial layer is formed and subsequently forming a first buffer layer;

forming pairs of second trenches coupled to the respective first trenches by etching the first buffer layer, the second interlayer insulating layers, and the second conductive layers;

removing the second sacrificial layer;

forming a channel layer in the first trenches and the pairs of the second trenches; and doping impurities onto tops and sidewalls of the channel layer.

5. The method of claim 1, wherein the impurities are doped using a plasma doping process or an ion implantation process.

6. The method of claim 1. further comprising:

alternately forming second interlayer insulating layers and second conductive layers over the first selection gates and subsequently forming a first buffer layer after the forming of the first select gates;

forming second channels formed to penetrate the second interlayer insulating layers, the second conductive layers, and the first buffer layer and coupled to the respective first channels;

removing the first buffer layer; and doping impurities onto tops and sidewalls of the second channels exposed by removing the first buffer layer.

7. The method of claim 6, further comprising:

forming a second gate insulating layer and a second conductive layer over an entire surface of a structure into which the impurities are doped;

forming a second interlayer insulating layer on the second conductive layer;

performing a planarization process until top surfaces of the plurality of second channels are exposed; and forming second selection gates having L shape by etching the second interlayer insulating layer, the second conductive layer, and the second gate insulating layer between neighboring second channels of the second channels.

8. The method of claim 7, further comprising silicidizing the second selection gates after the forming of the second selection gates.

9. A method of manufacturing a non-volatile memory device, the method comprising:

forming first channels protruding from a substrate;

forming a first sacrificial layer on an entire surface of a structure in which the first channels are formed;

forming a first interlayer insulating layer on the first sacrificial layer;

funning first slits between neighboring first channels of the first channels by etching the first interlayer insulating layer and the first sacrificial layer to form the first sacrificial layer having an L shape and remaining on sidewalls of the first channels;

forming first select gate regions by removing the first sacrificial layer exposed through the first slits; and forming first selection gates that each have an L shape by filling a first conductive layer in the first selection gate regions.

10. The method of claim 9, further comprising forming a first gate insulating layer on the entire surface of the structure in which the first channels are formed before the forming of the first sacrificial layer.

11. The method of claim 9, further comprising forming a first gate insulating layer on an entire surface of the first selection gate region before the forming of the first selection gates.

12. The method of claim 9, further comprising:

alternately forming second interlayer insulating layers and second sacrificial layers and subsequently forming a first buffer layer after the forming of the first selection gates;

forming second channels formed to penetrate the second interlayer insulating layers, the second sacrificial layers, and the first buffer layer and coupled to the respective first channels;

removing the first buffer layer; and doping impurities onto tops and sidewalls of the second channels exposed by removing the first buffer layer.

13. The method of claim 12, further comprising:

forming a third sacrificial layer on an entire surface of a structure into which the impurities are doped;

forming a third interlayer insulating layer on the third sacrificial layer;

performing a planarization process until top surfaces of the second channels are exposed;

forming second slits between neighboring second channels of the second channels by etching the third interlayer insulating layer, the third sacrificial layer, the second interlayer insulating layers, and the second sacrificial layers;

forming word line region and second selection gate regions by removing the second sacrificial layers and the third sacrificial layers exposed through the second slits; and forming second selection gates that each have an L shape and word lines by filling a second conductive layer in the word line regions and the second selection gate regions.

14. The method of claim 13, further comprising forming a charge blocking layer, a charge trap layer, and a tunnel insulating layer on surfaces of the word line regions and the second selection gate regions before the forming of the second selection gates and the word lines.

15. The method of claim 9, wherein forming the first channels comprises:
   etching pipe gates to form first trenches;
   forming a second sacrificial layer in the first trenches;
   alternately forming second interlayer insulating layers and third sacrificial layers over a structure in which the second sacrificial layer is formed and subsequently forming a first buffer layer;
   etching the first buffer layer, the second interlayer insulating layers, and the third sacrificial layers to form pairs of second trenches coupled to the respective first trenches;
   removing the second sacrificial layer; and
   forming a channel layer in the first trenches and the pairs of the second trenches; and
   doping impurities onto tops and sidewalls of the channel layer.

16. The method of claim 15, further comprising forming a charge blocking layer, a charge trap layer, and a tunnel insulating layer on inner surfaces of the first trenches and the second trenches before the forming of the channel layer.

17. The method of claim 15, further comprising forming a passivation layer in pairs of second trenches before the removing of the second sacrificial layer.

18. A method of manufacturing a non-volatile memory device, the method comprising:
   forming a first channel layer protruding from a substrate so that a top and a sidewall of the first channel layer are exposed over the substrate;
   doping impurities on the top and the sidewall of the first channel layer;
   forming a gate insulating layer surrounding a sidewall of the first channel layer;
   forming a selection gate including a first region surrounding the gate insulating layer and a second region protruding from the first region; and
   forming memory cells stacked on each other and sharing a second channel layer, wherein the second channel layer is coupled to the first channel layer,
   wherein the impurities are doped on the first channel layer before the gate insulating layer is formed.

19. The method of claim 18, wherein the impurities are doped using a plasma doping process.

20. The method of claim 18, wherein the impurities are doped using an ion implantation process.

* * * * *